(12) United States Patent
Qureshi et al.

(10) Patent No.: US 7,321,243 B1
(45) Date of Patent: Jan. 22, 2008

(54) P-DOMINO REGISTER WITH ACCELERATED NON-CHARGE PATH

(75) Inventors: Imran Qureshi, Austin, TX (US); Raymond A. Bertram, Austin, TX (US)

(73) Assignee: Via Technologies, Inc., Taipei (TW)

( * ) Notice: Subject to any disclaimer, the term of this patent is extended or adjusted under 35 U.S.C. 154(b) by 27 days.

(21) Appl. No.: 11/424,762

(22) Filed: Jun. 16, 2006

(51) Int. Cl.
  *H03K 19/20* (2006.01)
(52) U.S. Cl. ......................................... 326/121; 326/95
(58) Field of Classification Search ............ 326/93–98, 326/112, 119, 121
See application file for complete search history.

(56) References Cited

U.S. PATENT DOCUMENTS

| | | | |
|---|---|---|---|
| 5,075,386 A | 12/1991 | Vanderbilt | |
| 5,889,979 A | 3/1999 | Miller, Jr. et al. | |
| 5,926,038 A | 7/1999 | Fouts et al. | |
| 6,191,618 B1 | 2/2001 | Gayles et al. | |
| 6,265,899 B1 | 7/2001 | Abdel-Hafeez et al. | |
| 6,496,038 B1 | 12/2002 | Sprague et al. | |
| 6,560,737 B1 | 5/2003 | Colon-Bonet et al. | |
| 6,628,143 B2 | 9/2003 | Hsu et al. | |
| 6,650,145 B2 | 11/2003 | Ngo et al. | |
| 2002/0158670 A1 | 10/2002 | Alvandpour | |
| 2003/0042932 A1 | 3/2003 | Bales | |
| 2003/0052714 A1 | 3/2003 | Alvandpour | |
| 2003/0110404 A1 | 6/2003 | Seningen et al. | |
| 2004/0056685 A1 | 3/2004 | Azam et al. | |
| 2004/0257115 A1 | 12/2004 | Bertram et al. | |
| 2005/0046446 A1 | 3/2005 | Qureshi et al. | |
| 2005/0110522 A1 | 5/2005 | Hoekstra | |

*Primary Examiner*—Don Le
(74) *Attorney, Agent, or Firm*—Richard K. Huffman; James W. Huffman

(57) ABSTRACT

A P-domino register has a domino stage, a write stage, an inverter, a high keeper path, a low keeper path, and an output stage. The domino stage evaluates a logic function based on at least one input data signal and a pulsed clock signal. The pulsed clock signal lags a symmetric clock signal. The domino stage pre-discharges a pre-discharged node low when the symmetric clock signal is high and opens an evaluation window when the pulsed clock signal goes low, and pulls the pre-discharged node high if it evaluates, and keeps the pre-discharged node low if it fails to evaluate. The output stage provides an output signal based on states of the pre-discharged node and a second preliminary output node.

21 Claims, 11 Drawing Sheets

NON-INVERTING P-DOMINO REGISTER WITH ACCELERATED NON-CHARGE PATH

NON-INVERTING N-DOMINO REGISTER

NON-INVERTING N-DOMINO REGISTER – ALTERNATIVE EMBODIMENT

NON-INVERTING N-DOMINO REGISTER WITH IMPROVED STORAGE STAGE

NON-INVERTING P-DOMINO REGISTER WITH IMPROVED STORAGE STAGE

NON-INVERTING P-DOMINO REGISTER PULSED CLOCK TIMING

NON-INVERTING P-DOMINO REGISTER WITH ACCELERATED NON-CHARGE PATH

NON-INVERTING P-DOMINO REGISTER WITH ACCELERATED NON-DISCHARGE PATH TIMING

US 7,321,243 B1

P-DOMINO REGISTER WITH ACCELERATED NON-CHARGE PATH

CROSS-REFERENCE TO RELATED APPLICATIONS

This application is related to the following U.S. patent applications, each having a common assignee and common inventors.

| SER. NO. | FILING DATE | TITLE |
| --- | --- | --- |
| 10/640369 | Aug. 13, 2003 | NON-INVERTING DOMINO REGISTER |
| 11/023145 | Dec. 27, 2004 | NON-INVERTING DOMINO REGISTER |
| 11/251517 | Oct. 14, 2005 | N-DOMINO OUTPUT LATCH |
| 11/251399 | Oct. 14, 2005 | P-DOMINO OUTPUT LATCH |
| 11/424,762 | Jun. 16, 2006 | N-DOMINO REGISTER WITH ACCELERATED NON-DISCHARGE PATH |
| 11/251384 | Oct. 14, 2005 | P-DOMINO REGISTER |
| 11/463,976 | Aug. 11, 2006 | ACCELERATED N-CHANNEL DYNAMIC REGISTER |
| 11/463,980 | Aug. 11, 2006 | ACCELERATED P-CHANNEL DYNAMIC REGISTER |

BACKGROUND OF THE INVENTION

1. Field of the Invention

The present invention relates to dynamic logic and register functions, and more particularly to a P-domino output register with an accelerated non-charge path for registering the outputs of complex logic circuits where speed and size are important factors.

2. Description of the Related Art

Integrated circuits use a remarkable number of registers, particularly those having a synchronous pipeline architecture. Register logic is employed to hold the outputs of devices and circuits for a period of time so that these outputs can be received by other devices and circuits. In a clocked system, such as a pipeline microprocessor, registers are used to latch and hold the outputs of a given pipeline stage for a period of one clock cycle so that input circuits in a subsequent stage can receive the outputs during that period while the given pipeline stage is concurrently generating new outputs.

In the past, it has been common practice to precede and follow complex logical evaluation circuits, such as multiple input multiplexers (muxes), multi-bit encoders, etc., with registers to hold the inputs to and the outputs from the evaluation circuits. Generally, these registers have associated setup and hold time requirements, both of which constrain the evaluation circuits in the preceding stage. In addition, registers have corresponding data-to-output time characteristics, which constrain the evaluation circuits in subsequent stages. The "speed" of a register is typically judged in terms of its data-to-output time, that is, the sum of its setup time and clock-to-output time.

Preceding and following a logical evaluation circuit with traditional register circuits introduces delays into a pipeline system whose cumulative effect results in significantly slower operating speeds. More specifically, one notable source of these delays is the data-to-output time requirements that must be satisfied by logical evaluation circuits in order to ensure stable registered outputs. It is desired to reduce these delays to provide additional time in each stage and to thereby increase overall speed of the pipeline system.

U.S. Patent Application Publication No. 2005/0127952A1, entitled "Non-inverting Domino Register," which is incorporated by reference herein, addressed the problems described above. In the prior disclosure, a non-inverting domino register was described which combined logic evaluation functions with their corresponding registers to achieve a faster clock-to-output time than conventional approaches without compromising the stability of its output. The transitions of the output signal of the non-inverting domino register disclosed therein were shown to be very fast in response to transitions of the clock signal in contrast to the slower transition responses of conventional inverting domino registers. The prior non-inverting domino register, was also flexible with respect to configuration of evaluation logic, which could to be provided as N-channel logic, P-channel logic, or a combination thereof.

In U.S. Patent Application Publication No. 2006/0038589A1, entitled "P-Domino Register," which is incorporated by reference herein, a P-channel version of the non-inverting domino register is disclosed.

Both the N-channel and P-channel versions of the non-inverting domino register provide significant speed advantages when data inputs cause the non-inverting register to discharge a pre-charged node or to charge a pre-discharged node therein when clocked. But the present inventors have noted a desire to decrease clock-to-output time for both P-channel and N-channel versions of the non-inverting domino register when data inputs are such that the pre-charged node does not discharge or the pre-discharged node does not charge when clocked.

Consequently, it is desired to provide improved N-domino and P-domino registers with accelerated non-discharge or non-charge paths that provide all of the benefits of the prior non-inverting domino registers, and that are further flexible with regard to the domino stage, and that are moreover optimum for use in a high leakage or high noise environment.

SUMMARY OF THE INVENTION

In one embodiment, a non-inverting domino register is provided. The non-inverting domino register has a domino stage, a write stage, an inverter, a low keeper path, a high keeper path, and an output stage. The domino stage evaluates a logic function based on at least one input data signal and a pulsed clock signal. The pulsed clock signal lags a symmetric clock signal. The domino stage pre-discharges a pre-discharged node low when the symmetric clock signal is high and opens an evaluation window when the pulsed clock signal goes low, and pulls the pre-discharged node high if it evaluates, and keeps the pre-discharged node low if it fails to evaluate. The write stage is coupled to the domino stage. The write stage is responsive to the pulsed and symmetric clock signals, which pulls a first preliminary output node low if the pre-discharged node goes high, and which pulls the first preliminary output node high when the pre-discharged node and symmetric clock signal are low. The inverter has an input coupled to the first preliminary output node and an output coupled to a second preliminary output node. The low keeper path keeps the first preliminary output node low when enabled, where the low keeper path is enabled when the symmetric clock signal and the second preliminary output node are both high and which is otherwise disabled. The high keeper path keeps the first preliminary output node high when enabled, where the high keeper path is enabled when the second preliminary output node and the pre-charged node are both low and which is otherwise disabled. The output stage provides an output signal based on states of the pre-discharged node and the second preliminary output node.

In another embodiment, a domino register is contemplated. The domino register includes an evaluation circuit, a write circuit, an inverter, a keeper circuit, and an output circuit. The evaluation circuit pre-discharges a first node while a symmetric clock signal is high and evaluates a logic function for controlling a state of the first node when a pulsed clock signal goes low. The pulsed clock signal is derived from the symmetric clock signal. The write circuit is coupled to the first node and receives the symmetric clock signal. The write circuit drives a second node low if the first node is high, and drives the second node high if the first node stays low when the symmetric clock signal goes low. The inverter has an input coupled to the second node and an output coupled to a third node. The keeper circuit is coupled to the second and third nodes and the write circuit. The keeper circuit keeps the second node low while the third node and the symmetric clock signal are both high, and keeps the second node high while the third node and first node are both low. The output circuit provides an output signal based on states of the first and third nodes.

In a further embodiment, a method registering a logic function and generating a non-inverted output are comprehended. The method includes providing a symmetric clock signal and a pulsed clock signal that lags the symmetric clock signal; pre-discharging a first node low while the symmetric clock signal is high; evaluating a logic function to control the state of the first node when the pulsed clock signal goes low; controlling the state of a second node with the state of the first node when the symmetric clock signal goes low; defining the state of a third node as the inverted state of the second node; enabling a high state keeper path to keep the state of the second node high when the first and third nodes are both low, and otherwise disabling the high state keeper path; enabling a low state keeper path to keep the state of the second node low when the symmetric clock signal and the third node are both high, and otherwise disabling the low state keeper path; and determining the state of an output node based on the states of the first and third nodes.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application have recognized the need for providing registered outputs for logic circuits in which speed, size and stability are critical factors, which is flexible with regard to the evaluation logic, which may be used in high leakage or high noise environments, and which moreover exhibit accelerated clock-to-output times for specified data input states. They have has therefore developed non-inverting N-domino registers that have a faster data-to-output time than that which has heretofore been provided without compromising the stability of the output, that are flexible with regard to the evaluation logic implementation, and that may be used in a high leakage or high noise environment, as will be further described below with respect to FIGS. 1-11. When employed in a pipeline architecture that relies heavily on registers and dynamic logic to transfer data from stage to stage, a non-inverting P-domino register according to embodiments of the present invention enables overall device operating speed to be significantly increased. Consequently, the overall device may be implemented using faster and smaller devices in a high leakage or high noise process without compromising speed.

Figure 1:
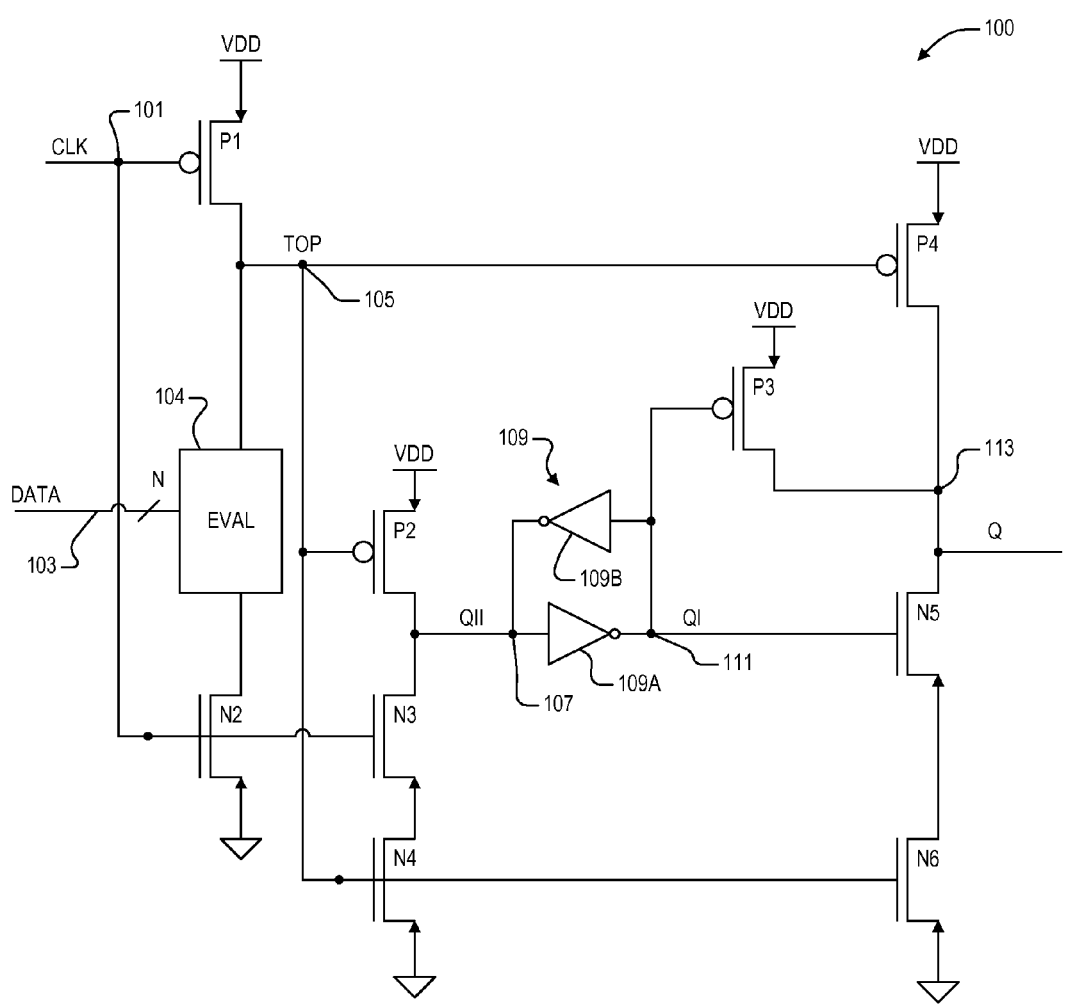
FIG. 1 is a schematic diagram of a non-inverting N-domino register implemented according to a prior disclosure which is incorporated by reference.

FIG. 1 is a schematic diagram of a non-inverting N-domino register 100 implemented as is disclosed in U.S. Patent Application Publication No. 2005/0127952A1. The non-inverting domino register 100 includes a logic evaluation input stage, or domino stage, which consists of stacked P-channel and N-channel devices P1 and N2 and evaluation logic 104. The P1 and N2 devices are a complementary pair of evaluation devices coupled on either side of evaluation logic 104 in the stack. The evaluation logic 104 may be as simple as a single N-channel device or may be significantly more complex for evaluation any desired logic function. The source of P1 is coupled to a voltage source VDD and its drain is coupled to node 105 providing a pre-charge signal TOP. The evaluation logic 104 is coupled between node 105 and the drain of N2, having its source coupled to ground. A clock signal CLK is provided via node 101 to the gates of P1 and N2. A set of N nodes 103 provide N input data signals DATA to the evaluation logic 104, where N is any positive integer.

The domino stage of the non-inverting N-domino register 100 is followed by a storage stage which includes devices P2, N3, and N4 and a weak keeper circuit 109. The devices P2, N3, and N4 may be considered as a "write stage" and the keeper circuit 109 as a keeper stage within the storage stage. Node 101 is coupled to the gate of N3 and node 105 is coupled to the gates of P2 and N4. The source of P2 is coupled to VDD and its drain is coupled to a first intermediate output node 107 providing a first intermediate output signal QII. Node 107 is coupled to the drain of N3, to the input of an inverter 109A and to the output of another inverter 109B. The output of the inverter 109A is coupled to a second intermediate output node 111 providing a second intermediate output signal QI, which is coupled to the input of the inverter 109B. The inverters 109A and 109B are cross-coupled between nodes 107 and 111 and collectively form the weak keeper circuit 109. The source of N3 is coupled to the drain of N4, which has its source coupled to ground.

The storage stage of the non-inverting domino register 100 is followed by an additional output stage, which includes P-channel devices P3 and P4 and N-channel devices N5 and N6. Node 105 is coupled to the gates of P4 and N6, and node 111 is coupled to the gates of P3 and N5. The sources of P3 and P4 are coupled to VDD and their drains are coupled together at an output node 113 providing an output signal Q. Output node 113 is coupled to the drain of N5, which has its source coupled to the drain of N6, which has its source coupled to ground. The P-channel devices generally operate as pull-up devices and the N-channel devices generally operate as pull-down devices.

Figure 2:
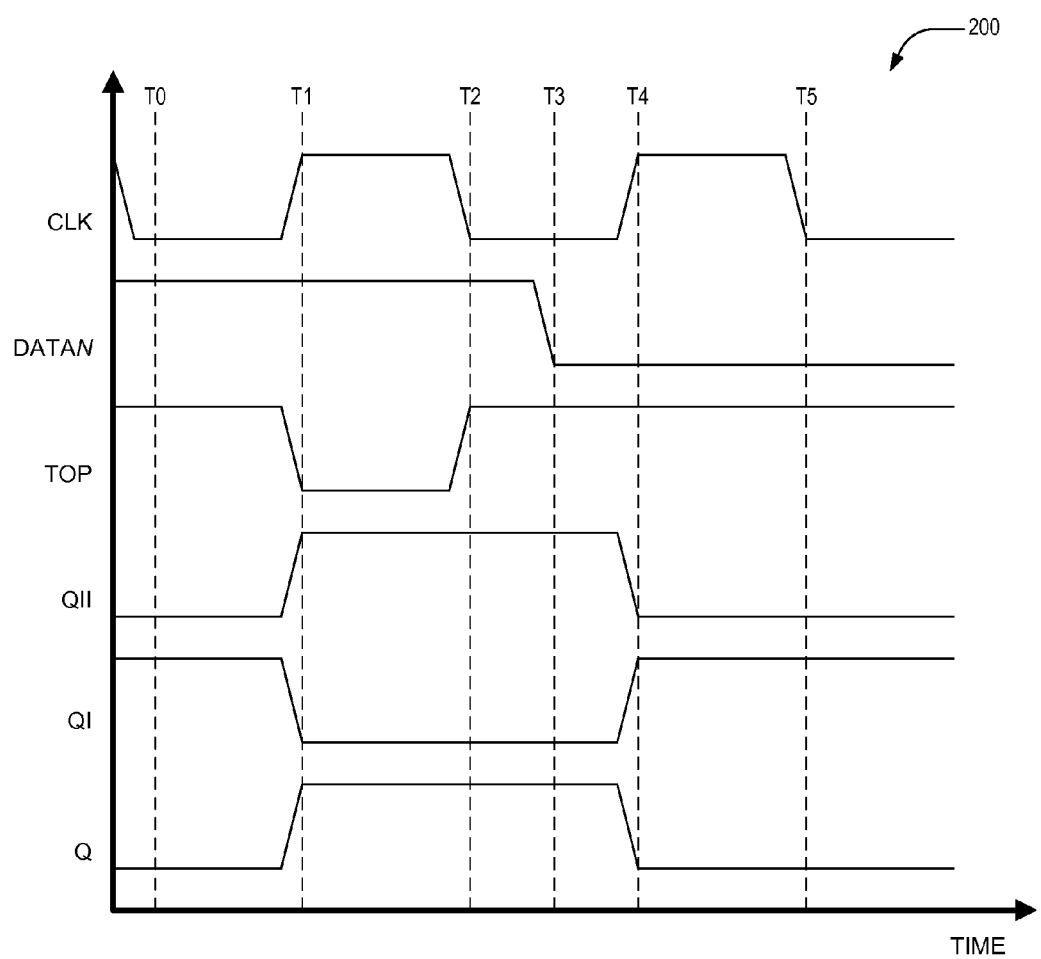
FIG. 2 is a timing diagram illustrating operation of the non-inverting N-domino register of FIGS. 1, 3-4, and 5.

FIG. 2 is a timing diagram illustrating operation of the non-inverting N-domino register 100, in which the CLK, DATAN, TOP, QII, QI and Q signals are plotted versus time. For clarity, the relative transitions times are estimated and delays are ignored. The DATAN signal is shown as a single signal representing the collective set of N DATA signals. The DATAN signal is shown asserted high for the case where the collective state of the data signals causes the evaluation logic 104 to "evaluate," thereby pulling the pre-charge signal TOP low, and is shown asserted low for the case where the evaluation logic 104 fails to evaluate, which keeps the pre-charge signal TOP high. Thus, when the evaluation logic 104 evaluates, it causes signal TOP to transition from its pre-charged high state to a low state. When the evaluation logic "fails to evaluate," TOP remains at its pre-charged high state. In other words, when the evaluation logic causes TOP to discharge, the level of signal TOP transitions from its pre-charged high state to a logic low level. When TOP remains at its pre-charged high logic level due to the evaluation logic 104 failing to evaluate, such is referred to as a "non-discharge" event.

Hence, at time T0, when the CLK signal is initially low, N2 is turned off and P1 is turned on, so that the domino stage pre-charges the TOP signal high. The TOP signal is pre-charged high in preparation for evaluation of the DATAN signal by the evaluation logic 104 upon the rising edge of CLK, where the DATAN signal is initially high. The pre-charged TOP signal turns on N4 and N6. The QII signal remains at its former state (shown initially in a low logic state) and is held there by the keeper circuit 109. The QI signal is initially high turning on N5, so that the Q output signal is initially pulled low via the N5 and N6 devices.

At time T1 the CLK signal goes high, which causes the TOP signal to discharge to a logic low level since the DATAN signal is high. In particular, N2 is turned on and the evaluation logic 104 pulls TOP low via N2 to ground. The QII signal is pulled high via P2 and the output signal Q is pulled high via P4. The QII and Q signals are both pulled high at about the same time T1, and the QI signal is pulled low by the inverter 109A. The inverted state of the QI signal at the output of the keeper circuit 109 drives the devices P3 and N5. When QI is high, P3 is off and N5 is on; and when QI is low, P3 is on and N5 is off. At subsequent time T2 when the CLK signal next goes low, the TOP signal is once again pre-charged high. P2 and N3 are turned off so that node 107 is not driven to either state. The respective states of the QII and QI signals remain unchanged, however, via operation of the keeper circuit 109, so that the Q and QII signals remain high and the QI signal remains low throughout the remainder of the half cycle of CLK.

The DATAN signal is shown going low at time T3 while the CLK signal is still low, and the CLK signal is next asserted high at time T4 while the DATAN signal is low. The evaluation logic 104 fails to evaluate, so that TOP remains high (i.e., a "non-discharge") while DATAN is low and CLK is high. The CLK and TOP signals turn on devices N3 and N4, respectively, so that the QII signal is asserted low at about time T4, and the QI signal is consequently pulled high by the inverter 109A. The TOP signal being high keeps N6 on. The QI signal turns N5 on and P3 off, so that the Q signal is pulled low via N5 and N6. The CLK signal next goes low at time T5 pulling TOP high again. The respective states of the QII and QI signals remain unchanged via operation of the keeper circuit 109. The Q signal remains low throughout the remainder of the cycle of CLK since QI keeps N5 on and TOP keeps N6 on.

The output signal Q transitions from low to high relatively quickly in response to a rising edge of the CLK signal when the evaluation logic 104 discharges the TOP signal to a low level. There is a delay through devices N2 and P4 (i.e., the discharge path) causing the output transition. The output signal Q transitions from high to low after a delay through devices N3, N5, and the inverter 109A (i.e., the non-discharge path) in response to a rising edge of the CLK signal when the evaluation logic 104 fails to evaluate, leaving the TOP signal high. The delay through the inverter 109A is minimized by being implemented as a relatively small device (with minimal capacitance) since it does not need to have the size nor perform the function of a buffer. In another embodiment, the delay can be minimized by employing ratioed logic (i.e., large P device and small N device) for the inverter 109A. It is appreciated by those of ordinary skill in the art that transitions of the output signal Q of the non-inverting N-domino register 100 are very fast in response to transitions of the CLK signal. If a non-inverting output is necessary or otherwise desired, the non-inverting N-domino register 100 provides superior data-to-output speed compared to conventional designs among other benefits and advantages. The non-inverting N-domino register 100 may be converted to an inverting N-domino register simply by adding an output inverter/buffer (not shown).

As operation of the circuit 100 of FIG. 1 has been described, one skilled in the art will appreciate that since the function of the evaluation logic 104 is to rapidly transition signal TOP from its pre-charged high level to a low level, one embodiment of the present invention employs ratioed P and N devices to configure the evaluation logic 104. In this embodiment, strong N devices and weak P devices are employed, resulting in faster operation.

Prior disclosure U.S. Patent Application Publication Serial No. 20040034681A1, which is herein incorporated by reference, discloses AND logic and OR logic (not shown herein), which may be used as the evaluation logic 104. It was described therein that any suitable combination of the AND and OR logic circuits are contemplated, and that any other complex logical evaluation circuit are contemplated, including, for example, multiple input multiplexers (muxes), multi-bit encoders, etc. Any desired simple to complex evaluation logic can be substituted for the evaluation logic 104 without adversely impacting the speed or associated power constraints of the non-inverting N-domino register 100. The AND and OR logic circuits were exemplary only and were provided to illustrate that the evaluation logic 104 may be any complex logical evaluation circuit as appreciated by those having ordinary skill in the art. A possible limitation of the inverting N-domino register 100, however, is that it is not particularly flexible with respect to the evaluation logic 104, which typically had to be implemented as N-channel logic. N-channel logic, in some configurations, does not provide optimal levels of input noise margin.

Figure 3:
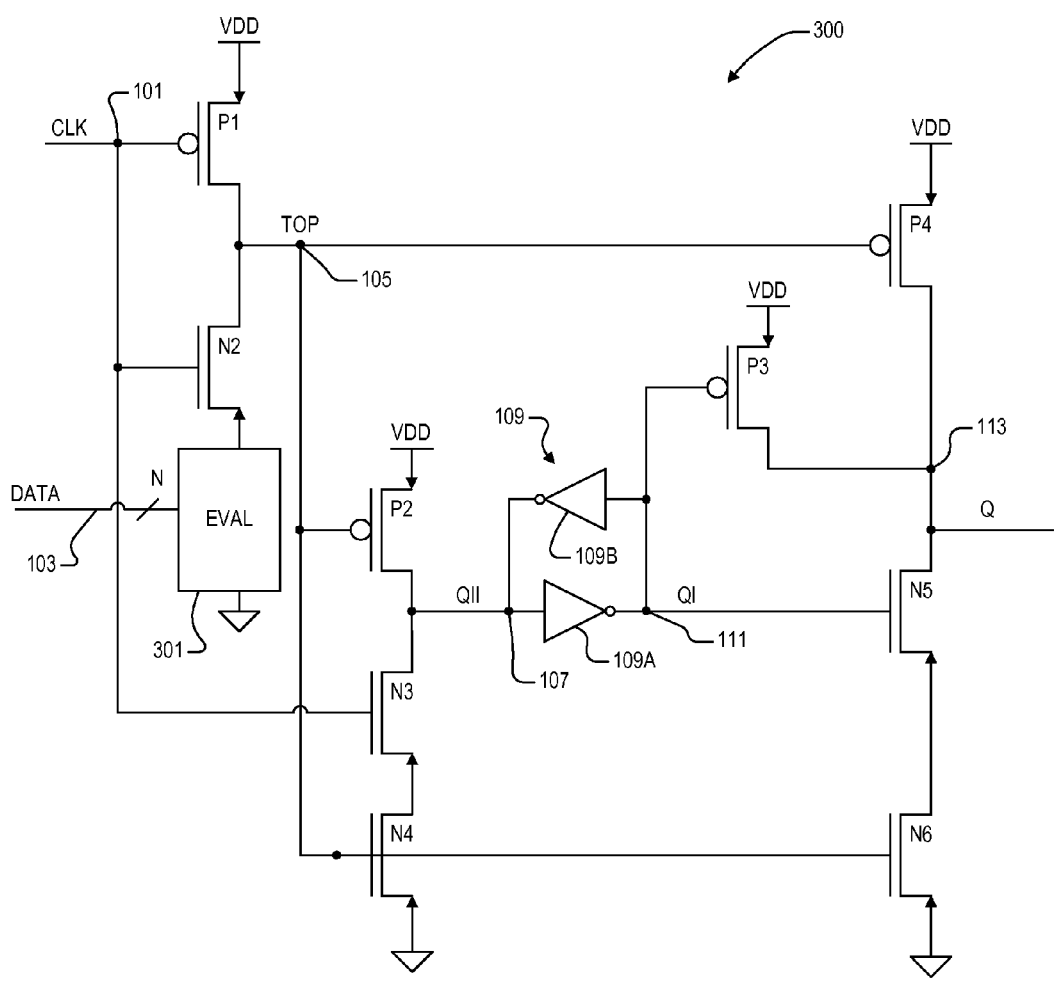
FIG. 3 is a schematic diagram of a non-inverting N-domino register implemented according to an alternative embodiment of the register of FIG. 1.

FIG. 3 is a schematic diagram of a non-inverting N-domino register 300 implemented according to an alternative embodiment of the register of FIG. 1, and is also disclosed in U.S. Patent Application Publication Serial No. 2005/0127952A1. The non-inverting N-domino register 300 is substantially similar to the non-inverting N-domino register 100 of FIG. 1, except that the logic evaluation input stage, or domino stage, comprising the stacked P-channel and N-channel devices P1 and N2 and evaluation logic 104, is reordered and the evaluation logic 104 is replaced with evaluation logic 301. The P1 and N2 devices are a complementary pair of evaluation devices coupled together at the node 105 providing the TOP signal. In this case, the drain of N2 is coupled to node 105 and its source is coupled to the top or upper end of the evaluation logic 301. The lower or bottom end of the evaluation logic 301 is coupled to ground. In this manner, the evaluation logic 301 is located below the P1/N2 stack as opposed to being coupled between P1 and N2. Operation is substantially similar to the non-inverting N-domino register 100 of FIG. 1 and the timing diagram of FIG. 2 remains equally valid for the non-inverting domino register 300 of FIG. 3.

The evaluation logic 301 could be configured in substantially the same manner as the evaluation logic 104. As understood by those skilled in the art, however, the evaluation logic 301 may alternatively be embodied using complementary metal-oxide semiconductor (CMOS) logic rather than N-channel logic, where again, the timing diagram of FIG. 2 remains valid. CMOS logic provides significantly better input level noise margin over N-channel logic so that the non-inverting N-domino register 300 provides significantly better input level noise margin over the non-inverting N-domino register 100 when using CMOS logic in the domino stage.

The non-inverting N-domino registers 100 and 300 both experience leakage effects when embodied in a high leakage or high noise process, such as 90 nm SOI and the like. Scaling circuits down to 90 nm introduces issues related to leakage. Scaled processes exhibit higher leakage because channel lengths are shorter. Consequently, in order to write a new state to node 107 of the storage stage for either of the registers 100 and 300, a weak device must be overcome within the feedback inverter (e.g., within the inverter 109B, a weak P-channel device to change to a low state and a weak N-channel device to change to a high state). The cost of overcoming a device is speed and current. In addition, in processes in which there is either high leakage or high noise, the weak N and P devices within the feedback inverter 109B must be made larger in order to maintain the state of the output node in the presence of leakage or noise.

Note, for example, that the storage node 107 (signal QII) is isolated from the input stage when CLK is low. There is nothing driving the QII signal except the keeper feedback inverter 109B, which includes internal weak N and P devices (not shown). Yet, because of increased leakage associated with a scaled process, a larger amount of leakage current flows through the P2 and N3 devices. So, the N and P devices in the inverter 109B have to be large enough to overcome that leakage. For instance, if the QII signal is high, leakage occurs to ground through the N3 and N4 devices, so that the P device within the inverter 109B has to be large enough to supply enough current to overcome that leakage to keep the QII signal high. In processes in which there is high leakage or high currents and the devices are off, wider and wider devices are needed to hold state. And the use of wider devices substantially reduces performance because when a new state is written, the wider device that is keeping the state must be overcome. To compensate for the reduction in speed, the storage stage devices P2, N3, and N4 are made larger to drive the new state to overcome that held by the large devices in the keeper feedback inverter 109B. Larger devices consume valuable space on an integrated circuit (IC).

Figure 4:
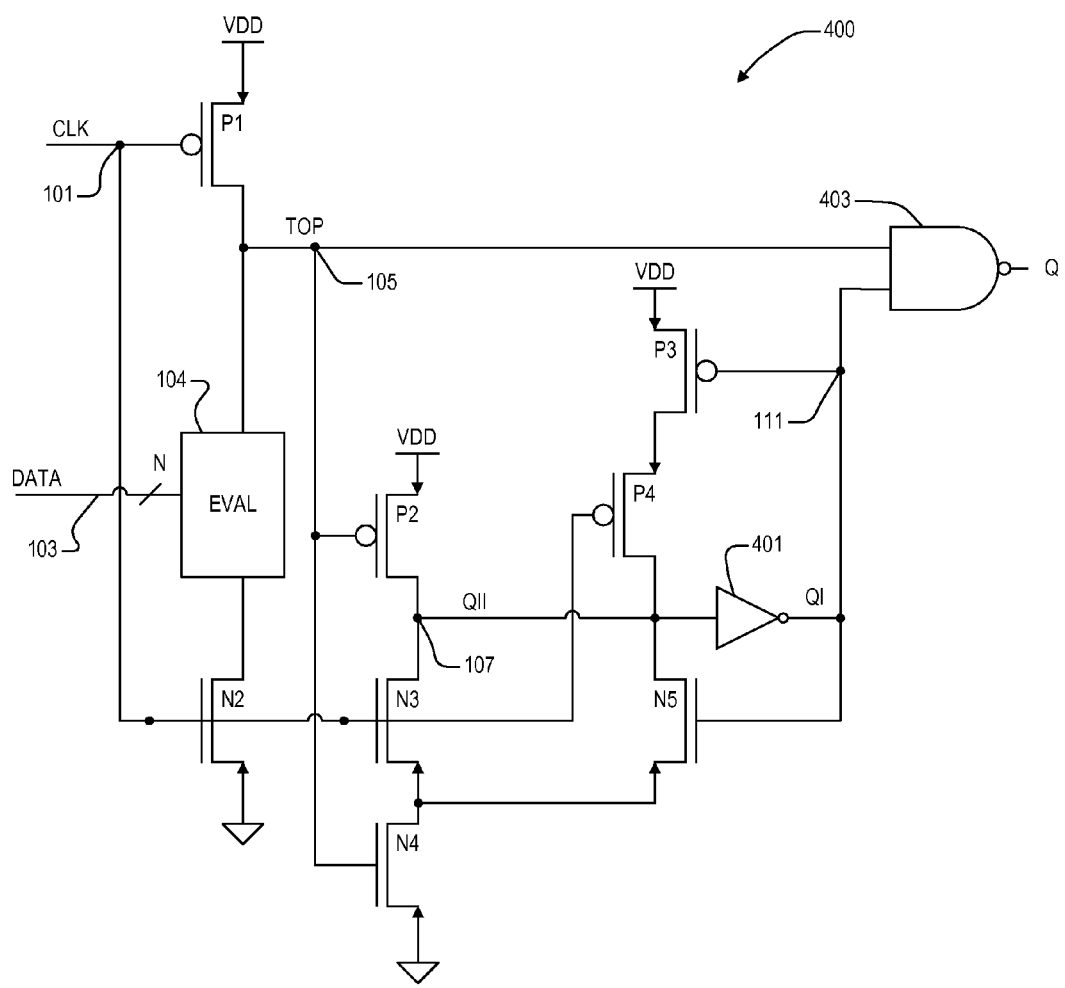
FIG. 4 is a schematic diagram of another non-inverting N-domino register exhibiting an improved storage stage.

FIG. 4 is a schematic diagram of another non-inverting N-domino register 400 exhibiting and improved storage stage and employing an improved keeper circuit. The non-inverting N-domino register 400 includes an input domino stage followed by a storage stage and an output stage. The domino stage and the initial portion of the storage stage of the register 400 are similar to those of the register 100. The keeper circuit of the register 400, however, is modified to improve performance by eliminating the need to overcome devices and reduce cost in terms of speed and current. The domino stage includes stacked P-channel and N-channel devices P1 and N2 and evaluation logic 104. As before, the P1 and N2 devices are a complementary pair of evaluation devices coupled on either side of evaluation logic 104 between the voltage source VDD and ground. The source of P1 is coupled to VDD and its drain is coupled to node 105 providing the TOP signal. The evaluation logic 104 is coupled between node 105 and the drain of N2 and the source of N2 is coupled to ground. The input clock signal CLK is provided via node 101 to the gates of P1, N2 and N3. A set of N nodes 103 provide N input data signals DATA to the evaluation logic 104. As before, the node 105 providing the TOP signal is coupled to the gates of devices P2 and N4. The initial portion of the storage stage is substantially the same write stage including the stacked devices P2, N3 and N4. The source of P2 is coupled to VDD and its drain is coupled to node 107 developing the first intermediate output signal QII. The drain of N3 is coupled to node 107 and its source is coupled to the drain of N4, having its source coupled to ground.

The storage stage of the non-inverting N-domino register 400 has the write stage including devices P3, P4, and N5 and a keeper stage including devices P3, P4, N3, and an inverter 401. The storage stage is followed by an output stage, which comprises a two-input NAND gate 403 in the embodiment illustrated. In this case, the source of P3 is coupled to VDD and its drain is coupled to the source of P4, having its drain coupled to the drain of N5 at the node 107. The source of N5 is coupled to the drain of N4 further coupled to the source of N3. Node 101, providing the CLK signal, is coupled to the gate of P4. Node 107, developing the QII signal, is coupled to the input of the inverter 401, having its output coupled to node 111 developing the second intermediate output signal QI. Node 111 is coupled to the gates of P3 and N5 and is coupled to one input of the NAND gate 403. Node 105, providing the TOP signal, is coupled to the other input of the NAND gate 403, and the output the NAND gate 403 provides the output Q signal.

The timing diagram of FIG. 2 is applicable for the non-inverting domino register 400 for this situation with only minor differences in timing, where such timing differences and small delays are ignored (e.g., delays through the inverter 401 and the NAND gate 403 are ignored for purposes of illustrating functionality in the timing diagram 200). Again, suppose that the QII signal is initially low and is to be asserted high. With reference to FIG. 2, at time T0, the CLK, Q and QII signals are initially low and the QI signal is high. Since CLK is low, P1 is turned on and TOP is pre-charged high turning on N4. Since QI and TOP are both high, the Q signal at the output of the NAND gate 403 is initially low. While CLK is low and QI is high, N5 is on, P3 is off, and P4 is on. In this case, therefore, N5 and N4 are both on providing a "low" state keeper path for the node 107 to ground which keeps the QII signal low. The low keeper path is enabled whenever the second preliminary output node 111 and the pre-charged node 105 are both high, and is otherwise disabled.

When the CLK signal goes high at time T1, N2 is turned on initiating evaluation of the DATA operands by the evaluation logic 104. As before, the DATAN signal, representing the input DATA operands, is shown initially high which causes the evaluation logic 104 to couple node 105 to the drain of N2. This causes the TOP signal to discharge to a low level through N2. TOP going low causes the NAND gate 403 to assert Q high at about time T1 (after a short delay through the NAND gate 403). Discharging TOP to a low level turns off N4, thereby disabling the low keeper path from N5 through N4 down to ground. And TOP going low turns P2 on so that the QII signal is pulled high at about time T1. When the QII signal goes high at time T1, the inverter 301 pulls the QI signal low, which turns P3 on and N5 off. The Q output signal stays low while the QI signal is low.

In this example, the low keeper path through N5 is disabled because N4 is turned off when the TOP signal goes low. And since N4 is turned off, P2 does not have to overcome N5 to pull the QII signal high. Whenever the QII signal is low and is to be pulled high in response to evaluation (pulling TOP low), the low keeper path is always disabled (because N4 is off) so that the write stage of the storage stage does not have to overcome a keeper device.

At time T2 when CLK next goes low, TOP is once again pre-charged high. Also at time T2, P4 is turned on providing a "high" state keeper path from node 107 to VDD via P4 and P3, thereby keeping the QII signal high. The high keeper path is enabled whenever the pre-charged node 105 and the second preliminary output node 111 are both low, and otherwise disabled. Thus, the QII signal is kept high, which in turn keeps QI low to maintain the state of the Q output signal while TOP goes high at time T2. The TOP signal going high turns N4 back on at about time T2, but since the QI signal is low, N5 is off thereby keeping the low keeper path turned off or disabled for the remainder of the cycle.

The DATAN signal goes low at time T3 and the CLK signal next goes high at time T4 while the DATAN signal is still low so that the evaluation logic 104 does not cause TOP to discharge. Accordingly, TOP remains high at time T4 so that N4 remains turned on. The CLK signal going high turns P4 off and N3 on. The high keeper path from node 107 to VDD is disabled since P4 is turned off, and N3 and N4 are both on pulling the QII signal low. Since P4 is off, N3 and N4 do not have to overcome any devices, including weak keeper devices, to pull QII low. Whenever the QII signal is high and is to be pulled low in response to failure of evaluation (in which TOP stays high), the high keeper path is always disabled (because P4 is off) so that the write stage of the storage stage does not have to overcome a keeper device. The inverter 401 pulls QI high at about time T4 in response to QII going low. Since QI and TOP are both high, the NAND gate 403 pulls Q low at about time T4. Also, QI going high turns N5 on and P3 off, so that the high keeper path is disabled and the low keeper path via N5 and N4 is re-enabled. When CLK next goes low at time T5, N3 is turned off but QII is kept low through the low keeper path since N5 and N4 are kept on. TOP and QI both remain high, so that Q remains low for the remainder of the CLK cycle.

The non-inverting N-domino register 400 of FIG. 4 employs an improved technique to disable the weak keeper feedback devices, so that when a new state is being written, a strong device internal to a keeper device does not have to be overcome. Consequently, the P3 and N5 devices are made wider to overcome leakage in order to maintain state, but without affecting speed because those same devices P3 and N5 are disabled when a new state is written to the storage node 107 (the QII signal). When writing a new state of the QII signal, a feedback keeper circuit does not have to be overcome, so that the devices P2 and N3 can be normal-sized devices. The "keeper" of the non-inverting domino register 400 is only enabled to store the state. In particular, the feedback devices are enabled to keep the state and disabled when writing a new state.

Figure 5:
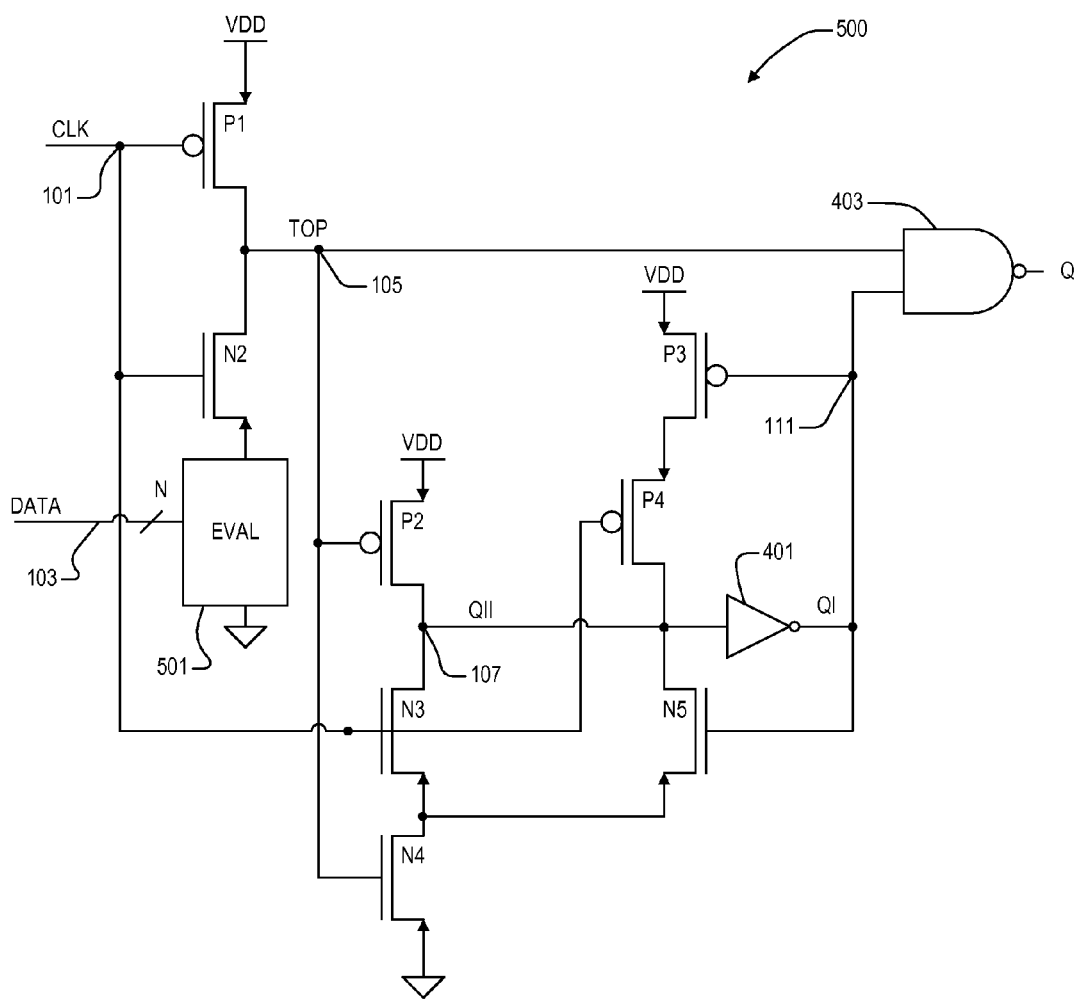
FIG. 5 is a schematic diagram of a non-inverting N-domino register employing the improved storage stage and implemented according to an alternative embodiment of the register of FIG. 4.

FIG. 5 is a schematic diagram of another non-inverting N-domino register 500 employing the improved keeper stage of the register 400 and implemented according to alternative embodiment. The non-inverting domino register 500 is substantially similar to the non-inverting domino register 400, except that the logic evaluation input stage, or domino stage, comprising the stacked P-channel and N-channel devices P1 and N2 and evaluation logic 104, is reordered, and the evaluation logic 104 is replaced with evaluation logic 501. The change to register 500 from register 400 is analogous to the change to register 300 from register 100. In this manner, the evaluation logic 501 of the non-inverting N-domino register 500 may be implemented with CMOS logic rather than N-channel logic, where again, the timing diagram of FIG. 2 remains applicable. As previously described, CMOS logic provides significantly better input level noise margin over N-channel logic so that the non-inverting N-domino register 500 provides somewhat better input level noise margin over the non-inverting N-domino register 400 when using CMOS logic in the domino stage.

A non-inverting N-domino register implemented according to embodiments thus described has a faster clock-to-output time than conventional approaches without compromising the stability of its output, Q. In addition, the storage stage may further be improved to allow for smaller, faster devices to be employed in a high leakage environment beyond those which would otherwise be required to overcome strong keeper devices. This enables the non-inverting N-domino register to be embodied in a high leakage or high noise process, such as 90 nm SOI and the like, without causing performance degradation caused by leakage factors. Thus, the benefits of a scaled process, including reduced size, voltage, power consumption, etc., may be attained without causing the performance degradation associated with such scaled processes.

The present inventors note that operation of the various embodiments of the non-inverting N-domino register as discussed above with reference to FIGS. 2-5 all have data hold time requirements that are a function of the duty cycle of clock signal CLK shown at node 101. More specifically, the data signals DATAN at node 103 must be held at the desired level for the duration of the time when clock signal CLK is high. If DATAN changes state(s) during the interval when CLK is high, then the state change will propagate through to the output Q. The present inventors also have observed that it is desirable in many register applications to provide embodiments of the non-inverting N-domino register that minimize hold time requirements for DATAN. Accordingly, a pulsed clock embodiment will now be discussed with reference to FIG. 6, wherein the embodiment is configured to minimize data hold time.

Figure 6:
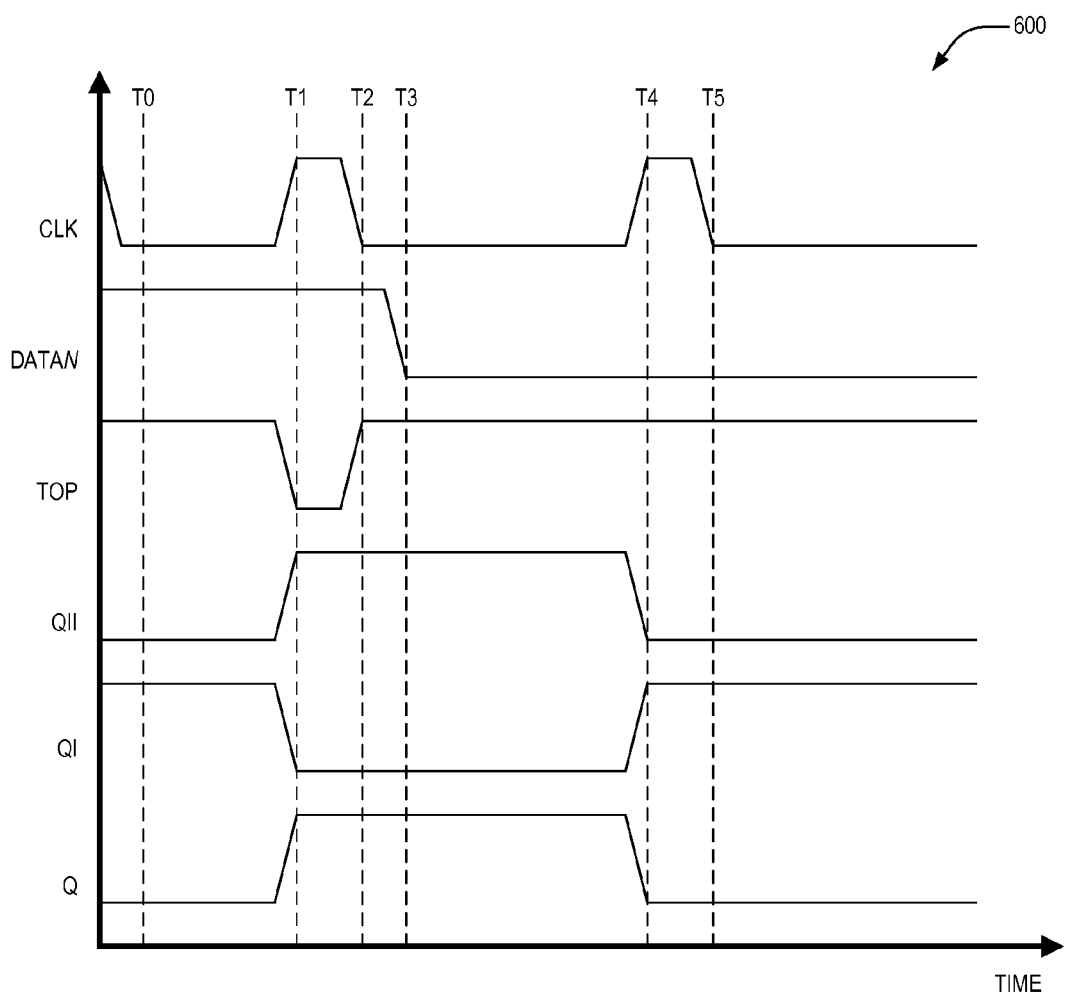
FIG. 6 is a timing diagram illustrating operation of the non-inverting N-domino registers of FIGS. 1, 3-4, and 5 according to a pulsed clock embodiment that is preferred to minimize hold time.

Turning to FIG. 6, a timing diagram 600 is presented illustrating operation of the non-inverting N-domino register of FIGS. 1, 3-4 and 5 according to a pulsed clock embodiment that is preferred to minimize hold time. Like the timing diagram 200 discussed above with reference to FIG. 2, the timing diagram 600 of FIG. 6 depicts the CLK, DATAN, TOP, QII, QI and Q signals are plotted versus time. For clarity, relative transitions times are estimated and delays are ignored. The DATAN signal is shown as a single signal representing the collective set of N DATA signals. The DATAN signal is shown asserted high for when the collective state of the data signals causes the evaluation logic 104 to evaluate thereby pulling the TOP signal low, and is shown asserted low for when the evaluation logic 104 fails to evaluate, which keeps the TOP signal high. At time T0 when the CLK signal is initially low, N2 is turned off and P1 is turned on, so that the domino stage pre-charges the TOP signal high. The TOP signal is pre-charged high in preparation for evaluation of the DATAN signal by the evaluation logic 104 upon the rising edge of CLK, where the DATAN signal is initially high. The pre-charged TOP signal turns on N4 and N6. The QII signal remains at its former state (shown initially in a low logic state) and is held there by the keeper circuit 109. The QI signal is initially high turning on N5, so that the Q output signal is initially pulled low via the N5 and N6 devices.

At time T1 the CLK signal goes high, which causes the TOP signal to discharge to a low level since the DATAN signal is high, and the state of DATAN propagates through the discharge path to the output Q. In particular, N2 is turned on and the evaluation logic 104 evaluates pulling TOP low via N2 to ground. The QII signal is pulled high via P2 and the Q output signal is pulled high via P4. The QII and Q signals are both pulled high at about the same time T1, and the QI signal is pulled low by the inverter 109A. The inverted state of the QI signal at the output of the keeper circuit 109 drives the devices P3 and N5. When QI is high, P3 is off and N5 is on; and when QI is low, P3 is on and N5 is off. At subsequent time T2 when the CLK signal next goes low, the TOP signal is once again pre-charged high. P2 and N3 are turned off so that node 107 is not driven to either state. The respective states of the QII and QI signals remain unchanged, however, via operation of the keeper circuit 109, so that the Q and QII signals remain high and the QI signal remains low throughout the remainder of the half cycle of CLK.

The DATAN is shown going low at time T3 while the CLK signal is still low, and the CLK signal is next asserted high at time T4 while the DATAN signal is low. The evaluation logic 104 fails to evaluate, so that TOP remains high while CLK is high, and the state of DATAN propagates through the non-discharge path to the output Q. More specifically, the CLK and TOP signals turn on devices N3 and N4, respectively, so that the QII signal is asserted low at about time T4, and the QI signal is consequently pulled high by the inverter 109A. The TOP signal being high keeps N6 on. The QI signal turns N5 on and P3 off, so that the Q signal is pulled low via N5 and N6. The CLK signal next goes low at time T5 pulling TOP high again. The respective states of the QII and QI signals remain unchanged via operation of the keeper circuit 109. The Q signal remains low throughout the remainder of the cycle of CLK since QI keeps N5 on and TOP keeps N6 on.

The Q signal transitions from low to high relatively quickly in response to a rising edge of the CLK signal when the evaluation logic 104 evaluates discharging the TOP signal low. There is a negligible delay through devices N2 and P4 causing the output transition. The Q signal transitions from high to low after a delay through devices N3, N5, and the inverter 109A in response to a rising edge of the CLK signal when the evaluation logic 104 fails to evaluate leaving the TOP signal high. The delay through the inverter 109A is minimized by being implemented as a relatively small device (with minimal capacitance) since it does not need to have the size nor perform the function of a buffer. It is appreciated by those of ordinary skill in the art that transitions of the output Q signal of the non-inverting N-domino register 100, 300, 400, 500 are very fast in response to transitions of the CLK signal. If a non-inverting output is necessary or otherwise desired, the non-inverting N-domino register 100, 300, 400, 500 provides superior data-to-output speed compared to conventional designs among other benefits and advantages. The non-inverting N-domino register 100, 300, 400, 500 may be converted to an inverting N-domino register simply by adding an output inverter/buffer (not shown).

It is noted that the only difference between the timing diagram 200 of FIG. 2 and the timing diagram 600 of FIG. 6 is that node 103 of the non-inverting N-domino registers 100, 300, 400, 500 of FIGS. 1, 3-4, and 5 are each coupled to a pulsed clock signal CLK rather than being coupled to an approximately symmetric clock signal CLK. Accordingly, the hold time requirement for data signal DATAN is reduced significantly over the embodiments discussed with reference to FIG. 2. In one embodiment, the duty cycle of the pulsed clock signal CLK is less than or equal to 10 percent. In comparing the embodiments of FIGS. 2 and 6, it is noted that the time from T1 (when CLK goes high) until T3 (when the state of DATAN is allowed to change) is markedly less than the comparable period of FIG. 2. Such an embodiment of the non-inverting N-domino register is preferred for minimizing hold time.

It is additionally noted that since the state of DATAN is allowed to propagate through to output Q when CLK is high, the configurations discussed with reference to FIGS. 1, 3, 4, and 5 can also be embodied an N-domino latch when node 101 is coupled to an approximately symmetric latch clock CLK and where node 103 receives latch data DATAN. The latch data DATAN may be provided by a preceding domino circuit for which a latching function is desired. The circuits 100, 300, 400, 500 of FIGS. 1, 3-4, and 5 are advantageous when used as N-domino latch embodiments because of an accelerated discharge path through node 105 to the output signal Q, thus allowing for more domino circuits in series to precede node 103 than has heretofore been provided for. The N-domino latch embodiments will now be discussed with reference to FIG. 7.

Figure 7:
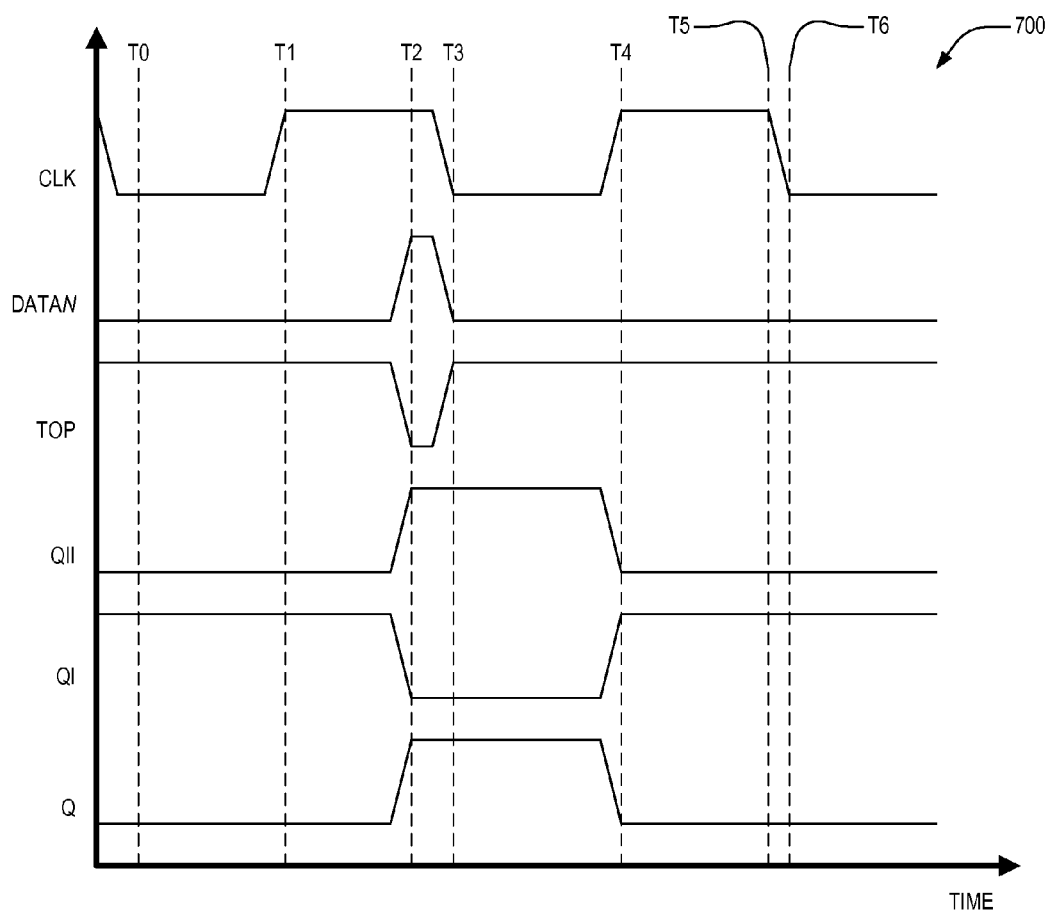
FIG. 7 is a timing diagram illustrating operation of a non-inverting N-domino latch embodiment that employs the circuits of FIGS. 1, 3-4, and 5.

Turning to FIG. 7, a timing diagram 700 is presented illustrating operation of N-domino latch embodiments. To employ the circuits 100, 300, 400, 500 of FIGS. 1, 3-4, and 5 as N-domino latch embodiments, it is desirable to couple node 101 to an approximately symmetric latch clock signal CLK. In one embodiment, the latch clock signal CLK exhibits from a 40 percent to a 60 percent duty cycle. By way of overview, it is noted that during the period when CLK is high, an evaluation window is opened where DATAN is allowed to change and the output Q follows DATAN. But when CLK goes low, the state of DATAN is latched until CLK goes back high. Hence, at time T0, CLK is low and TOP is pre-charged. The previous state (i.e., the state prior to CLK going low) of DATAN is latched through signals QII, QI, and through to the output Q. At time T1, CLK goes back high, opening up a window in which the state of DATAN is allowed to propagate though to the output Q. Since DATAN is low, the output Q remains low. At time T2, DATAN goes high causing signal TOP to discharge, thus turning on P2 and causing the output Q to go high. But at time T3, CLK goes back low, closing the evaluation window and latching the state of DATAN, thus keeping Q high during this period. DATAN also goes back low at T3, reflecting the state of a preceding domino stage whose output is coupled to node 803. TOP precharges at time T3, setting up for the next evaluation window when CLK goes high at time T4. Since DATAN is low at time T4, TOP does not discharge. Thus at time T4, N3 and N4 are on, driving QII low and QI high. Because both QI and TOP are high at T4, Q is driven low. At time T5, because DATAN is still low (i.e., the preceding domino stage did not evaluate), TOP remains high and the low state remains at the output Q. At time T6, CLK goes back low, latching in the state of DATAN at the output Q during the period when CLK is low.

One skilled in the art will also appreciate that, in some configurations, DATAN is embodied as a "return-to-zero" signal group, generally returning to a low logic level when CLK goes low. Consequently, device N2 can be entirely removed from the circuit 100, 300, 400, 500 in an N-domino latch embodiment, which increases the speed of the circuit 100, 300, 400, 500. When device N2 is removed, such a configuration is referred to a "footless" N-domino latch.

Figure 8:
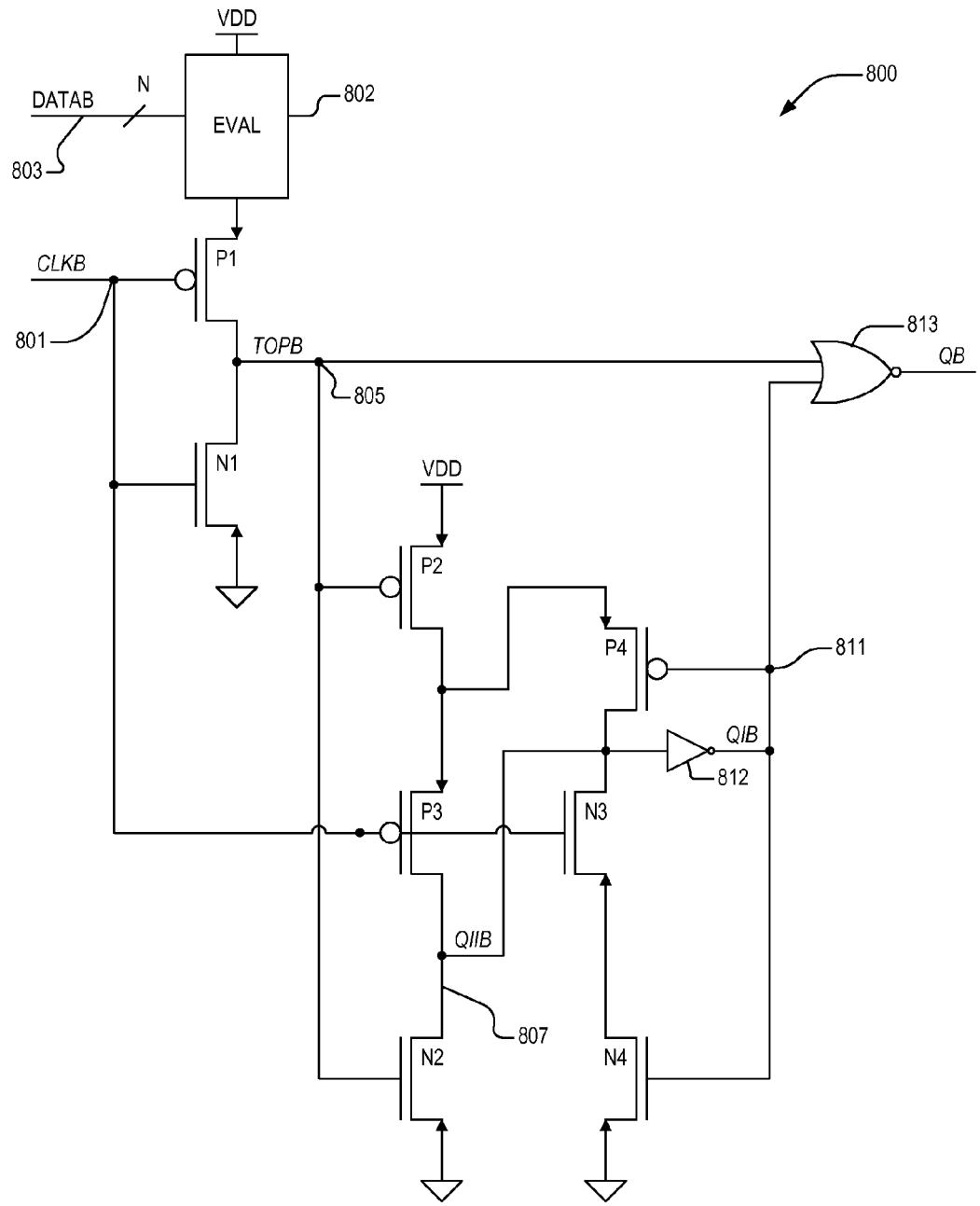
FIG. 8 is a schematic diagram of a non-inverting P-domino circuit employing an improved storage stage.

Now referring to FIG. 8, a schematic diagram is presented of a P-domino circuit 800 employing an improved storage stage. The P-domino circuit 800 may be employed as either a latch or a register, exhibiting advantages over the prior art when employed in either configuration. And like the N-domino circuit 500 of FIG. 5, employment of the P-domino output circuit 800 as either a latch or a register is primarily based upon the type of clock signal and data inputs to which the P-domino circuit 800 is coupled. For a register application, a pulsed clock is employed. For a latch application, an approximately symmetric clock signal is employed. For clarity, discussion of the circuit 800 below is restricted to a summary of its employment as a P-domino register 800. A more detailed description of employment of the circuit 800 of FIG. 8 as both a register and a latch is provided in the following U.S. patent applications, which are herein incorporated by reference for all intents and purposes:

| SER. NO. | FILING DATE | TITLE |
|---|---|---|
| 11/251399 | Oct. 14, 2005 | P-DOMINO OUTPUT LATCH |
| 11/251384 | Oct. 14, 2005 | P-DOMINO REGISTER |

Configuration and operation of the P-domino circuit 800 is similar to operation of the N-domino circuit embodiments described above with reference to FIGS. 1-7, when it is noted that many of the signals and signal states are inverted as described below. The P-domino circuit 800 includes three stages, including an evaluation stage, a latching stage, and an output stage. The evaluation stage is formed by a P-channel device P1, an N-channel device N1 and evaluation logic 802. The evaluation logic 802 of the non-inverting P-domino register 800 may be implemented with CMOS logic rather than P-channel logic, thus providing significantly better input level noise margin over P-channel logic so that the non-inverting P-domino register 800 provides somewhat better input level noise margin. The latching stage is formed by P-channel devices P2 and P3, and an N-channel device N2, coupled in a stack configuration. The output stage is formed by a P-channel device P4, N-channel devices N3 and N4, an inverter 812, and a two-input NOR gate 813. A clock signal CLKB is provided via node 801 to the gates of P1, N1, P3, and N3. The source of N1 is coupled to ground (relative to a source voltage VDD) and its drain is coupled to a pre-discharge node 805 developing a pre-discharge signal referred to as TOPB. The drain of P1 is coupled to node 805 and its source is coupled to the output of the evaluation logic 802, which has its input coupled to a set of N nodes 803 providing input data signals DATAB to the evaluation logic, where N is any positive integer.

The P1 and N1 devices form a complementary pair of evaluation devices with the evaluation logic 802 providing for evaluation of the N input data signals DATAB. And, as in the N-domino embodiments of FIGS. 1 and 4, the evaluation logic 802 may be interchanged in cascade circuit position with device P1 to allow for alternative configurations. In such configurations, P1's source would be coupled to source voltage VDD. Furthermore, one skilled in the art will appreciate that since the function of the evaluation logic 802 is to rapidly transition signal TOPB from its pre-charged low level to a high level, the employment of ratioed P and N devices (strong P devices and weak N devices) will result in faster operation. Thus, when the evaluation logic 802 "evaluates," it causes signal TOPB to transition from its pre-discharged low state to a high state. When the evaluation logic 802 "fails to evaluate," TOPB remains at its pre-discharged low state.

Node 805 providing the TOPB signal is coupled to the gates of devices P2 and N2 and to one input of the NOR gate 813. The source of P2 is coupled to VDD and its drain is coupled to the source of P3, having its drain coupled to a node 807 developing a first intermediate output signal QIIB. The drain of N2 is coupled to node 807 and its source is coupled to ground. The source of P4 is coupled to the drain of P2 and its drain is coupled to the drain of N3, having its source coupled to the drain of N4. The source of N4 is coupled to ground. Node 807 is coupled to the node formed by the drains of P4 and N3 and to the input of the inverter 812, where the output is coupled to node 811 developing a second intermediate output signal QIB. The QIB signal is driven to the opposite logic state as the QIIB signal after one gate delay through the inverter 812. Node 811 is coupled to the gates of P4 and N4 and to the other input of the NOR gate 813. The output the NOR gate 813 provides the output QB signal.

Figure 9:
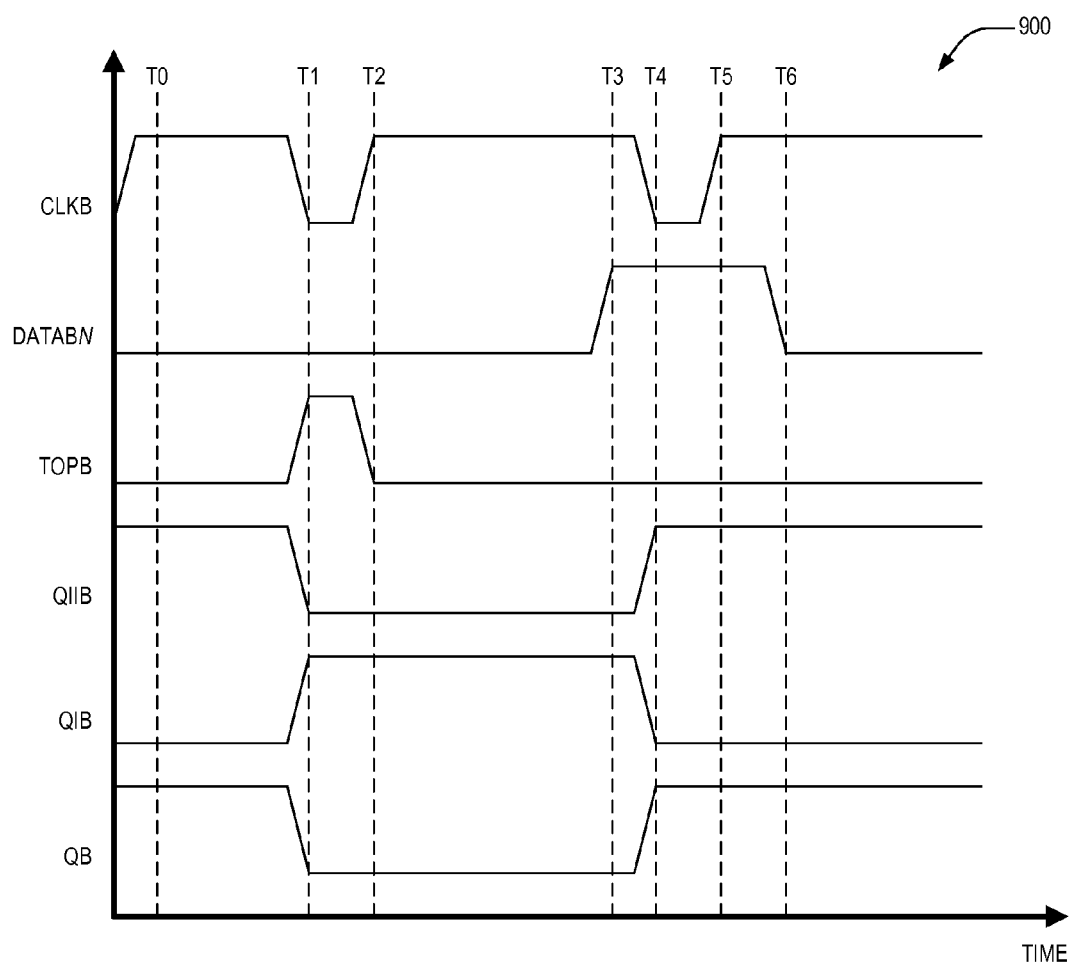
FIG. 9 is a timing diagram illustrating operation of the non-inverting P-domino circuit of FIG. 8 when employed as a register according to a pulsed clock embodiment that is preferred to minimize hold time.

Now turning to FIG. 9, a timing diagram is presented illustrating operation of the P-domino circuit 800 when employed as a P-domino register in which the signals CLKB, DATABN, TOPB, QIIB, QIB, and QB are plotted versus time. Several simplifications are made in the timing diagrams. The delays through each device or component (N-channel devices, P-channel devices, logic gates, multiplexers, etc.) are shown to be equal since they are roughly equivalent to each other, and the rise and fall times are also shown to be equal, since these times are also roughly equivalent. The DATABN signal is shown as a single signal representing the collective set of N DATAB signals. The DATABN signal is shown asserted low for the case where the collective state of the data signals causes the evaluation logic 802 to "evaluate," thereby pulling ("charging") the pre-discharge signal TOPB high, and is shown asserted high for the case where the evaluation logic 802 fails to evaluate, which keeps the pre-discharge signal TOPB low ("non-charging"). Thus, when the evaluation logic 802 evaluates, it causes signal TOPB to transition from its pre-discharged low state to a high state. When the evaluation logic 802 "fails to evaluate," TOPB remains at its pre-discharged low state. In other words, when the evaluation logic 802 causes TOPB to charge, the level of signal TOPB transitions from its pre-discharged low state to a logic high level. When TOPB remains at its pre-discharged low logic level due to the evaluation logic 802 failing to evaluate, such is referred to as a "non-charge" event. The timing diagram illustrates two CLKB cycles. As described above, to employ the P-domino circuit 800 as a P-domino register, it is desirable to couple node 801 to an pulsed clock signal CLKB, similar to the pulsed clock signal CLK discussed with reference to the N-domino register in FIG. 6. In one embodiment, CLKB has a duty cycle less than or equal to 10 percent.

At an initial time T0, the QIIB signal is high and is to be asserted low in response to the CLKB signal going low since the DATABN signal is low. Also at time T0, the CLKB signal is high while the QIB signal is low. Since CLKB is high, N1 is turned on, P1 is off, and TOPB is "pre-discharged" low so that P2 and N3 are both turned on. Since QIB and TOPB are both low, the QB signal at the output of the NOR gate 813 is initially high. While CLKB is high and QIB is low, N4 is off, N3 is on, and P4 is on. Also, P2 is on since TOPB is low. In this case, therefore, P4 and P2 are both on providing a "high" state keeper path for the node 807 to VDD, which keeps the QIIB signal high.

The DATABN signal, representing the one or more input data operands, is shown initially low, which causes the evaluation logic 802 to pull the source of P1 up to a high logic level. When the CLKB signal goes low at time T1 while DATAN is low, P1 is turned on. When P1 is turned on, the TOPB signal is pulled high via P1 and the evaluation logic 802. TOPB going high causes the NOR gate 813 to assert QB low. Also, TOPB going high at time T1 turns N2 on so that the QIIB signal is pulled low. In response to the QIIB signal going low, the inverter 812 pulls the QIB signal high. QIB going high turns N4 on and turns P4 off.

At time T2, CLKB goes high, and TOPB is once again pre-discharged low through N1. The QIB signal being high keeps N4 on which keeps QIIB low and QIB high to maintain the state of the QB output signal while TOPB goes low. The TOPB signal going low turns P2 back on, but since the CLKB signal is high, P3 is off so that the QIIB signal is not pulled high.

The DATAN signal goes high at time T3 to set up for the next edge of CLKB, and thus, the evaluation logic 802 does not pull the source of P1 high. The CLKB signal next goes low at time T4, turning P1 on. Since DATAN is still high, TOPB does not charge, and thus remains low at time T4. The CLKB signal going low turns N3 off and P3 on. Since N2 remains off and P2 and P3 are both turned on, the QIIB signal is pulled high. The inverter 812 pulls QIB low in response to QIIB going high. Since QIB and TOPB are now both low, the NOR gate 813 pulls QB high. The CLKB signal next goes high at time T5, turning on N1 and keeping TOPB low. The respective states of the QIIB and QIB signals remain unchanged, and the QB signal remains high throughout the remainder of the cycle of CLKB. At time T6, DATABN goes back low.

The P-domino register embodiment of the circuit 800 of FIG. 8 is well-suited for critical timing paths upon evaluate (i.e., "charge") conditions because approximately only two stages of gate delay are presented during an evaluation period (when CLKB is low). By coupling node 801 to a pulsed clock source CLKB as described herein, hold time requirements for the N data signals DATAB coupled to node 803 are minimized. For example, in the timing diagram of FIG. 9, DATABN can change state any time following time T2 (or time T5) because the state is registered at QB until CLKB goes low again, opening up the next evaluation window.

One skilled in the art will also appreciate that, in some configurations, DATABN may be embodied as a "return-to-one" signal group, generally returning to a high logic level when CLKB goes high. Consequently, device P1 can be entirely removed from the circuit 800 in a P-domino latch embodiment, which increases the speed of the circuit 800 for some applications. When device P1 is removed, such a configuration is referred to a "headless" P-domino latch.

Reference is made in the above discussion to propagation of the state of DATABN when the clock signal CLKB goes low, through either the charge path (i.e., signal TOPB charging from a low level to a high level) or the non-charge path (i.e., TOPB staying at its pre-discharge low level) to the output QB. More specifically, when the clock signal CLKB goes low, if the output QB is initially high (i.e., QIB is low and QIIB is high) and DATABN is low, TOPB charges through P1 and the evaluation logic 802 and propagates rapidly through the NOR gate 813 to the output QB. However, a longer delay is encountered through the non-charge path in the case were QB is initially low (i.e., QIB is high and QIIB is low) and DATABN is high upon the falling edge of CLKB, as is illustrated at time T4 in FIG. 9. In particular, the delay for the non-charge path includes propagation delays through P3, the inverter 812, and the NOR gate 813. Consequently, the present inventors have observed that this non-charge path delay is limiting in some cases and that it is moreover desirable to minimize the clock-to-output time in the case where the evaluation logic 802 does not cause TOPB to charge. To reduce the non-charge path delay, an exemplary embodiment of the present invention will now be presented with reference to FIGS. 10-11.

Figure 10:
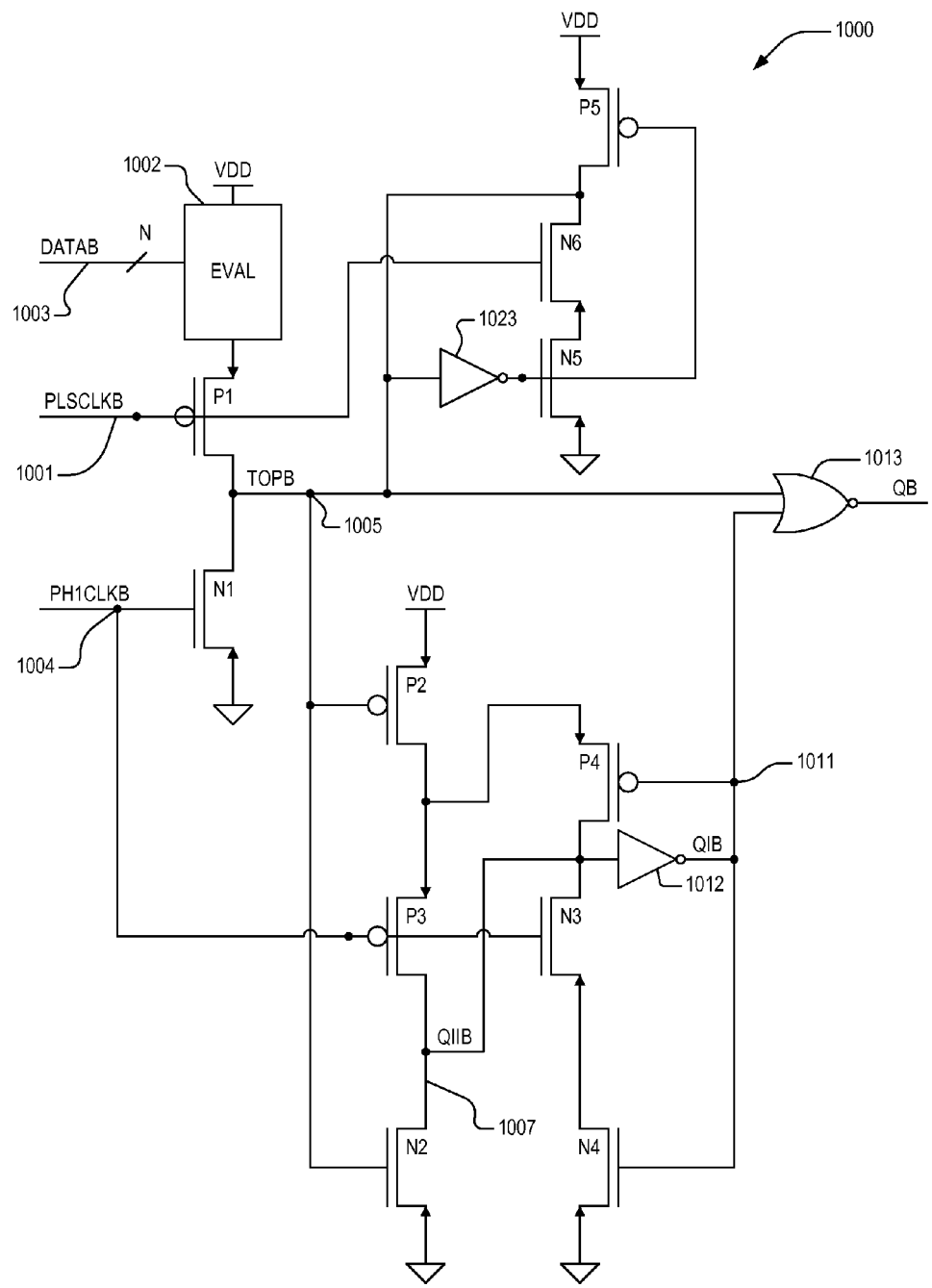
FIG. 10 is a schematic diagram of a non-inverting P-domino register according to an exemplary embodiment of the present invention which exhibits an accelerated non-charge path.

Turning to FIG. 10, a schematic diagram is presented of a non-inverting P-domino register 1000 according to an exemplary embodiment of the present invention which exhibits an accelerated non-charge path. The non-inverting P-domino register 1000 has an evaluation stage including stacked devices P1, N1, and evaluation logic 1002, which are configured to operate in substantially the same manner as the corresponding devices of the non-inverting P-domino register 800 described above with reference to FIG. 8. A pulsed clock signal PLSCLKB is provided via a node 1001 to the gate of P1 and a local clock signal PHICLKB, from which the pulsed clock signal PLSCLKB is derived, is provided via a node 1004 to the gate of N1. As one skilled in the art will appreciate, it is common practice to derive a pulsed clock signal PLSCLKB for use with dynamic logic circuits, such as the register 1000 of FIG. 10, from a local clock signal PHICLKB. The local clock signal PHICLKB is an approximately symmetric signal in duty cycle and the pulsed clock signal PLSCLKB has a relatively short duty cycle in comparison. In addition, the pulsed clock signal PLSCLKB, because it is derived from the local clock signal PH1CLKB, lags the local clock signal PH1CLKB by approximately two gate delays. In a current technology embodiment, the local clock signal PHI CLKB is asserted low for approximately 200 picoseconds and the pulsed clock signal PLSCLKB is asserted low for a time period according to configuration that allows for propagation of a true state of N input data signals DATAB from previous logic stages. One embodiment of the present invention contemplates a pulsed clock signal PLSCLKB that is at a logic low level for a range of 40 to 100 picoseconds. In addition, the pulsed clock signal PLSCLKB lags the local clock signal PHI-CLKB by typically a value commensurate with the number of gate delays exhibited by the logic employed to generate the pulsed clock signal PLSCLKB. In one embodiment, the lag is approximately 20 picoseconds. Although these embodiments are presented as typical, the present invention contemplates other embodiments as well.

The non-inverting P-domino register 1000 is shown in FIG. 10 in a configuration that allows for implementation of the evaluation logic 1002 with CMOS logic rather than P-channel logic as previously described, thus providing significantly better input level noise margin. However, it is noted that embodiments of the present invention also comprehend configurations of the evaluation stage (or "domino stage") where P1 and the evaluation logic 1002 are reordered.

In the embodiment shown in FIG. 10, the domino stage includes stacked P-channel and N-channel devices P1, N1 and evaluation logic 1002. The P1 and N1 devices are a complementary pair of evaluation devices coupled together between a ground reference voltage and the evaluation logic 1002. The source of N1 is coupled to ground and its drain is coupled to node 1005 providing a pre-discharge signal TOPB. The drain of P1 is coupled to node 1005 and its source is coupled to the evaluation logic 1002. The evaluation logic 1002 is coupled between the source of P1 and VDD. As noted above, the local clock signal PH1CLKB is provided via node 1004 to the gate of N1, and also to the gates of devices P3 and N3. A set of N nodes 1003 provide N input data signals DATAB to the evaluation logic 1002. As before, the node 1005 providing the TOPB signal is coupled to the gates of devices P2 and N2. The initial portion of the storage stage is substantially the same as described above with reference to FIG. 8 including the stacked devices P2, P3, and N2. The source of N2 is coupled to ground and its drain is coupled to node 1007 developing a first intermediate output signal QIIB. The drain of P3 is coupled to node 107 and its source is coupled to the drain of P2. The source of P2 is coupled to VDD.

The storage stage of the non-inverting P-domino register 1000 has a write stage including devices P2, P3, and N2 and a keeper stage including devices P4, N3, N4, and an inverter 1012. The storage stage is followed by an output stage, which comprises a two-input NOR gate 1013 in the embodiment illustrated. In this case, the source of N2 is coupled to ground and its drain is coupled to the drain of P3 at node 1107. The source of P4 is coupled to VDD and the drain of P4 is coupled to the drain of N3 and to node 1007. The source of N3 is coupled to the drain of N4 and the source of N4 is coupled to ground. Node 1007 is also coupled to the input of the inverter 1012 and the output of the inverter 1012 is coupled to node 1011, which is coupled to the gates of P4 and N4. Node 1004, providing the local clock signal PHI-CLKB, is coupled to the gates of P3 and N3. The output of the inverter 1012 that is coupled to node 1011 develops a second intermediate output signal QIB. Node 1011 is also coupled to one input of the NOR gate 1013. Node 1005, providing the TOPB signal, is coupled to the other input of the NOR gate 1013, and the output the NOR gate 1013 provides an output signal QB.

The pre-discharge node 1005 is additionally coupled to a low keeper circuit including devices N5-N6 and an inverter 1023. Node 1005 couples to the input of the inverter 1023 and to the drain of N6. The source of N6 is coupled to the drain of N5. And the source of N5 is coupled to ground. The output of the inverter 1023 is coupled to the gate of N5. The pulsed clock signal PLSCLKB is coupled to the gate of N6, thus enabling the low keeper circuit during the period when the pulsed clock signal PLSCLKB is high. The pre-discharge node 1005 is also coupled to a high keeper circuit comprising device P5. The output of inverter 1023 is coupled o the gate of P5. The source of P5 is coupled to VDD and its drain is coupled to node 1005. This high keeper circuit is required for the period of time between when PLSCLKB goes high until PHI CLKB goes high.

Figure 11:
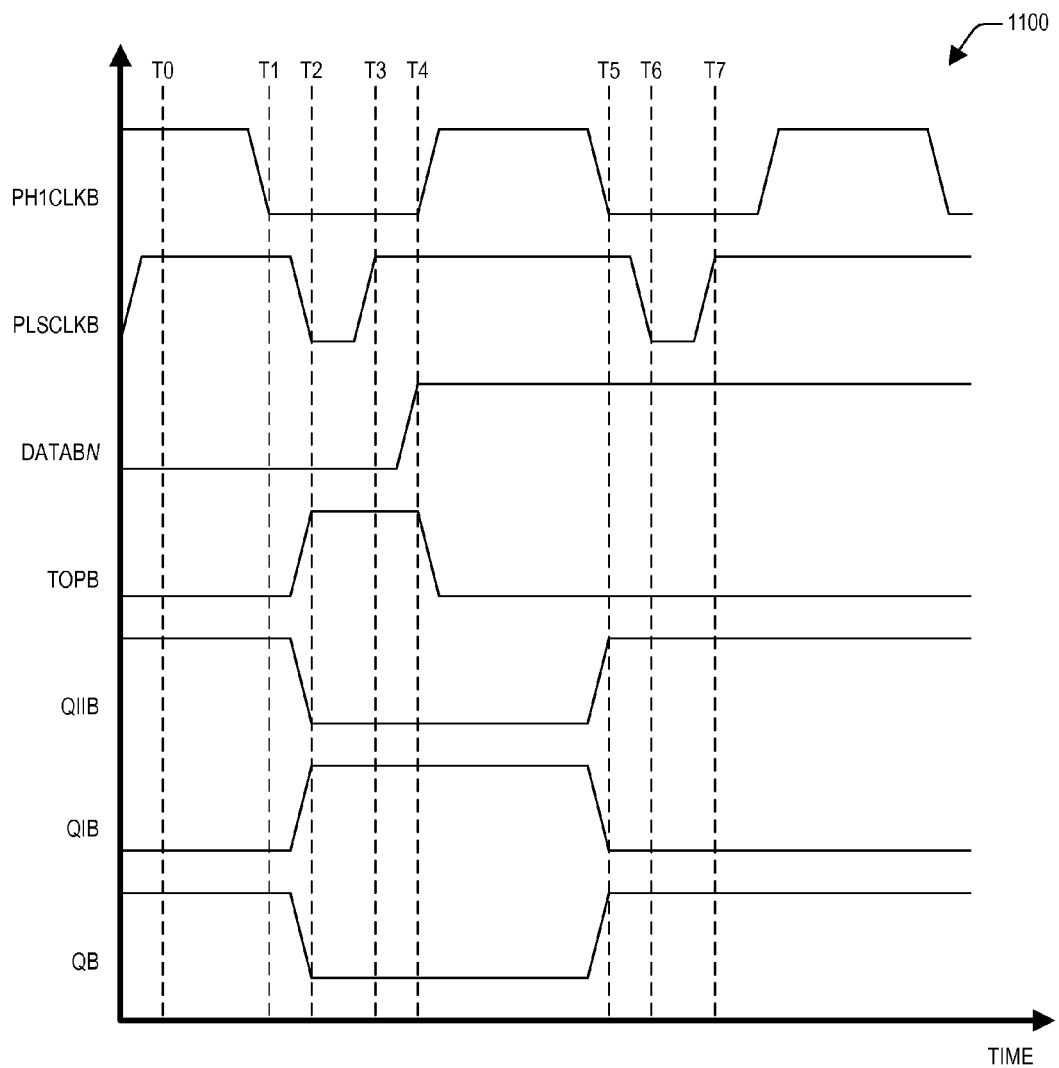
FIG. 11 is a timing diagram illustrating operation of the non-inverting P-domino register of FIG. 10.

Now tuning to FIG. 11, a timing diagram 1100 is presented illustrating operation of the non-inverting P-domino register 1000 of FIG. 10. Like the timing diagram 900 discussed above with reference to FIG. 9, the timing diagram 1100 of FIG. 11 depicts the DATABN, TOPB, QIIB, QIB and QB signals plotted versus time. In addition, the local clock signal PH1CLKB and the pulsed clock signal PLSCLKB are shown plotted versus time. For clarity, relative transitions times are estimated and delays are ignored, except that the delay from PH1CLKB going low to PLSCLKB going low is depicted in order to illustrate how the non-inverting P-domino register 1000 according to the present invention provides for substantial acceleration of clock-to-output time for the case in which the pre-discharged node TOPB does not charge (i.e., the non-charge path) to a logic high level. The DATABN signal is shown as a single signal representing the collective set of N DATAB signals. The DATABN signal is shown asserted low for the case when the collective state of the data signals DATAB causes the evaluation logic 1002 to evaluate thereby pulling the TOPB signal high (i.e., "charging"), and is shown asserted high for when the evaluation logic 1002 fails to evaluate, which keeps the TOPB signal low.

At time T0, when the PHICLKB signal and PLSCLKB signal are initially high, P1 is turned off and N1 is turned on, so that the domino stage pre-discharges the TOPB signal low. In addition, a high state on PLSCLK turns on N6. A resulting high state on the output of inverter 1023 turns on N5, thus keeping TOPB low in the absence of any other drivers. The TOPB signal is pre-discharged low in preparation for evaluation of the DATABN signal by the evaluation logic 1002 upon the falling edge of PLSCLKB, where the DATABN signal is initially low. The pre-discharged TOPB signal turns on P2 and turns off N2. P3 is off since PH1CLKB is high. The QIIB signal thus remains at its former state (shown initially in a high logic state) and is held there by the keeper stage. The QIB signal is consequently low, turning on P4, and the QB output signal is initially pulled high via the NOR gate 1013.

At time T1, the PHI CLKB signal goes low, which turns on P3 and turns off N3. Since TOPB is low and P2 is already on, turning on P3 provides a direct path to VDD for QIIB through P2 and P3. Since QIIB was previously high, the output QB remains unchanged at this point.

At time T2, PLSCLKB goes low opening up an evaluation window for DATABN, which causes the TOPB signal to charge to a high level since the DATABN signal is low, and the state of DATABN propagates through the charge path to the output QB. In particular, P1 is turned on and the evaluation logic 1002 evaluates pulling TOPB high through P1 to VDD. This state is sensed by the NOR gate 1013, which drives QB low. In parallel, the QIIB signal is pulled low via N2 which drives QIB high through the inverter 1012, thus providing another high input to the NOR gate to keep QB low. A high level on QIB turns on N4 and turns off P4, which sets up state for when PH1CLKB goes back high.

At subsequent time T3 when the PLSCLKB signal next goes high, the evaluation window is closed by turning off P1. In this manner, the length of the PLSCLKB signal establishes hold time requirements for input data DATABN.

PH1CLKB goes high at time T4, causing the TOPB signal to once again be pre-discharged low. P3 and N2 are turned off so that node 1007 is not driven to either state. Thus, the respective states of the QIIB and QIB signals remain unchanged, so that the QB and QIIB signals remain low and the QIB signal remains high throughout the remainder of the half cycle of PH1CLKB.

The DATABN signal is shown going high at time T4 while the PHI CLKB signal is still high, and the PHI CLKB signal is next asserted low at time T5 while the DATABN signal is high. The advantages of clocking the non-charge path with the local clock signal PH1CLKB, but enabling the evaluation window with the derived pulsed clock signal PLSCLKB are exhibited for the following case where QB is initially low and DATABN is high, as is the case at time T5. Rather than waiting for the pulsed clock signal PLSCLKB to open the evaluation window by turning on P1, a non-charge path acceleration scenario is initiated when PHI CLKB goes low at time T5. This turns on P3, and since P2 is already on due to TOPB being low, QIIB is driven high and QIB goes low. Since both TOPB and QIB are low, the NOR gate 1013 trips, providing a high state on QB —prior to when PLSCLKB goes low at time T6. Thus, the clock-to-output time when DATABN propagates through the non-charge path is accelerated due to clocking P3 and N3 with PHI CLKB, prior to opening up the evaluation window with the derived pulsed clock PLSCLKB.

At time T6, PLSCLKB goes low, turning on P1 and turning off N6. Since DATABN is high, TOPB does not charge, and since QIIB is already high, the output QB remains unchanged. One skilled in the art will appreciate that if DATABN were to have been low rather than high at time T6, a high glitch would have been seen between times T5 and T6.

At time T7, PLSCLKB goes back high, turning off P1 and closing the evaluation window for DATABN. In summarizing the embodiment illustrated by the timing diagram 1100 of FIG. 11, it is noted that the time to propagate a high state on DATABN through to the output (i.e., the clock-to-output time) when QB is initially low (time T5 of FIG. 11) is markedly less than other embodiments discussed herein. Such an embodiment of the non-inverting P-domino register 1000 is preferred for accelerating the clock-to-output time for cases where TOPB does not charge.

A non-inverting P-domino register with accelerated non-charge path implemented according to an embodiment of the present invention is faster by at least two gate delays as compared to that which has heretofore been provided under conditions in which the output QB changes state from a low level to a high level. The improved design with reduced delay is very useful in critical timing paths. Note that in the improved design, the non-charge path is no long the critical delay. Since the clock-to-output delay for the non-charge path may become shorter than the clock-to-output delay for the charge path, the former path may be intentionally slowed down to match the latter, if desired. This can be achieved by downsizing the devices in the group P2, P3, N2, and inverter 1012. Thus, an overall saving in layout area may be achieved.

Another benefit of the improved design according to the present invention is a reduction in input hold requirements due to a reduced PLSCLKB pulse width requirement. Now, PLSCLKB (when low) need only be wide enough to pull TOPB high in the charge path case. In the non-charge path case, PLSCLKB effectively plays no role.

Although the present invention has been described in considerable detail with reference to certain preferred versions thereof, other versions and variations are possible and contemplated. For example, although the present disclosure contemplates implementations and is described herein with regard to MOS type devices, including CMOS devices and the like, such as, for example, NMOS and PMOS transistors, it may also be applied in a similar manner to different or analogous types of technologies and topologies, such as bipolar devices or the like. In addition, those skilled in the art should appreciate that they can readily use the disclosed conception and specific embodiments as a basis for designing or modifying other structures for providing out the same purposes of the present invention without departing from the scope of the invention as defined by the appended claims.

What is claimed is:

1. A non-inverting register, comprising:
a domino stage, coupled to a pulsed clock signal, and for evaluating a logic function according to the states of at least one data signal and a pulsed clock signal, said pulsed clock signal lagging a symmetric clock signal, wherein said domino stage pre-discharges a pre-discharged node low when said symmetric clock signal is high, and opens an evaluation window when said pulsed clock signal goes low, and pulls said pre-discharged node high if it evaluates, and keeps said pre-discharged node low if it fails to evaluate;
a write stage, coupled to said domino stage and responsive to said pulsed and symmetric clock signals, which pulls a first preliminary output node low if said pre-discharged node goes high and which pulls said first preliminary output node high when said pre-discharged node and symmetric clock signal are low;
an inverter having an input coupled to said first preliminary output node and an output coupled to a second preliminary output node;
a low keeper path which keeps said first preliminary output node low when enabled, wherein said low keeper path is enabled when said symmetric clock signal and said second preliminary output node are both high and which is otherwise disabled;

a high keeper path which keeps said first preliminary output node high when enabled, wherein said high keeper path is enabled when said second preliminary output node and said pre-discharged node are both low and which is otherwise disabled; and an output stage which provides an output signal based on states of said pre-charged node and said second preliminary output node.

2. The non-inverting domino register of claim 1, wherein said domino stage comprises:

an N-channel device having a gate receiving said symmetric clock signal, and a drain and source coupled between ground and said pre-discharged node;

an P-channel device having a gate receiving said pulsed clock signal, a drain coupled to said pre-discharged node, and a source; and evaluation logic, coupled between a source voltage and said source of said P-channel device.

3. The non-inverting domino register of claim 2, wherein said evaluation logic comprises complementary metal-oxide semiconductor logic.

4. The non-inverting domino register of claim 1, wherein said write stage comprises:

a first N-channel device, having a gate coupled to said pre-discharged node, and a drain and source coupled between ground and said first preliminary output node;

a first P-channel device, having a gate receiving said symmetric clock signal, a drain coupled to said first preliminary output node, and a source; and a second P-channel device, having a gate coupled to said pre-discharged node, a drain coupled to said source of said first P-channel device, and a source coupled to a source voltage.

5. The non-inverting domino register of claim 4, wherein said low keeper path comprises:

a second N-channel device, having a gate coupled to said second preliminary output node, a source coupled to ground, and a drain; and a third N-channel device having a gate receiving said symmetric clock signal, and a drain and source coupled between said drain of said second N-channel device and said first preliminary output node.

6. The non-inverting domino register of claim 5, wherein said high keeper path comprises:

a second P-channel device, having a gate coupled to said second preliminary output node, a drain coupled to said first preliminary output node, and a source; and a third P-channel device, having a gate coupled to said pre-discharged node, a source coupled to a source voltage, and a drain coupled to said source of said second P-channel device.

7. The non-inverting domino register of claim 1, wherein said output stage comprises a NOR gate.

8. The non-inverting domino register of claim 1, wherein said domino stage, said write stage, said inverter, said high and low keeper paths, and said output logic are fabricated using a scaled 90 nanometer silicon-on-insulator process.

9. A domino register, comprising:

an evaluation circuit that pre-discharges a first node while a symmetric clock signal is high and that evaluates a logic function for controlling a state of said first node when a pulsed clock signal goes low, wherein said pulsed clock signal is derived from said symmetric clock signal;

a write circuit, coupled to said first node and receiving said symmetric clock signal, that drives a second node low if said first node is high, and that drives said second node high if said first node stays low when said symmetric clock signal goes low;

an inverter having an input coupled to said second node and an output coupled to a third node;

a keeper circuit, coupled to said second and third nodes and said write circuit, that keeps said second node low while said third node and said symmetric clock signal are both high, and that keeps said second node high while said third node and first node are both low; and an output circuit providing an output signal based on states of said first and third nodes.

10. The domino register of claim 9, wherein said evaluation circuit comprises:

an N-channel device, coupled to said first node and receiving said symmetric clock signal, that pre-discharges said first node low while said symmetric clock signal is high;

a P-channel device, coupled to said first node and receiving said pulsed clock signal; and a logic circuit, coupled between said P-channel device and a source voltage, that evaluates said logic function based on at least one input data signal;

wherein said N-channel device and said P-channel device collectively enable said logic circuit to control said state of said first node when said symmetric and pulsed clock signals are low.

11. The domino register of claim 10, wherein said logic circuit comprises complementary metal-oxide semiconductor devices.

12. The domino register of claim 9, wherein said write circuit comprises:

a first N-channel device, coupled to said first and second nodes, that pulls said second node low if said first node goes high;

a first P-channel device, coupled to said second node and receiving said symmetric clock signal; and a second P-channel device, coupled to said first P-channel device and to said first node;

wherein said first and second P-channel devices collectively pull said second node high if said first node remains low in response to said symmetric clock signal going low.

13. The domino register of claim 11, wherein said keeper circuit comprises:

second and third N-channel devices, coupled together and to said second and third nodes, that collectively form a low state keeper path which is enabled to keep said second node low when said third node and said symmetric clock signal are both high and which is otherwise disabled; and a second P-channel device, coupled to said second and third nodes and to said second N-channel device, wherein said second and third P-channel devices collectively form a high state keeper path which is enabled to keep said second node high when said first and third nodes are both low, and which is otherwise disabled.

14. The domino register of claim 9, wherein said output circuit comprises a NOR gate.

15. The domino register of claim 9, wherein said evaluation circuit, said write circuit, said inverter, said keeper circuit and said output logic are integrated using a scaled 90 nanometer silicon-on-insulator process.

16. A method of registering a logic function and generating a non-inverted output, comprising:

providing a symmetric clock signal and a pulsed clock signal that lags the symmetric clock signal;

pre-discharging a first node low while the symmetric clock signal is high;
evaluating a logic function to control the state of the first node when the pulsed clock signal goes low;
controlling the state of a second node with the state of the first node when the symmetric clock signal goes low;
defining the state of a third node as the inverted state of the second node;
enabling a high state keeper path to keep the state of the second node high when the first and third nodes are both low, and otherwise disabling the high state keeper path;
enabling a low state keeper path to keep the state of the second node low when the symmetric clock signal and the third node are both high, and otherwise disabling the low state keeper path; and
determining the state of an output node based on the states of the first and third nodes.

17. The method of claim 15, wherein said evaluating a logic function to control the state of the first node comprises pulling the first node high when the logic function evaluates and keeping the first node low when the logic function fails to evaluate.

18. The method of claim 16, wherein said controlling the state of a second node with the state of the first node comprises pulling the second node low if the first node is pulled high and pulling the second node high if the first node remains low when the symmetric clock signal goes low.

19. The method of claim 15, wherein said enabling a high state keeper path and otherwise disabling the high state keeper path comprises controlling first and second series-coupled pull-up devices with the first and third nodes, respectively.

20. The method of claim 15, wherein said enabling a low state keeper path and otherwise disabling the low state keeper path comprises controlling first and second series-coupled pull-down devices with the symmetric clock signal and the third node, respectively.

21. The method of claim 15, wherein said determining the state of an output node comprises logically combining the states of the first and third nodes with a NOR function.

* * * * *